(12) United States Patent
Yanagisawa et al.

(10) Patent No.: US 7,737,478 B2
(45) Date of Patent: Jun. 15, 2010

(54) PHOTOELECTRIC CONVERSION DEVICE AND ELECTRONIC DEVICE PROVIDED WITH THE PHOTOELECTRIC CONVERSION DEVICE

(75) Inventors: Makoto Yanagisawa, Kanagawa (JP); Atsushi Hirose, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/053,948

(22) Filed: Mar. 24, 2008

(65) Prior Publication Data

US 2008/0237669 A1 Oct. 2, 2008

(30) Foreign Application Priority Data

Mar. 26, 2007 (JP) .............................. 2007-078571

(51) Int. Cl.
*H01L 31/113* (2006.01)
(52) U.S. Cl. ...................... 257/292; 257/296; 257/444; 257/E27.132; 257/E31.083
(58) Field of Classification Search ......... 257/291–296, 257/444, E27.132, E27.133, E27.135, E31.048, 257/E31.125
See application file for complete search history.

(56) References Cited

U.S. PATENT DOCUMENTS

| 5,241,575 | A | 8/1993 | Miyatake et al. |
|---|---|---|---|
| 5,936,231 | A | 8/1999 | Michiyama et al. |
| 6,243,155 | B1 | 6/2001 | Zhang et al. |
| 6,287,888 | B1 | 9/2001 | Sakakura et al. |
| 6,495,816 | B1 | 12/2002 | Brodeur |
| 6,642,500 | B2 | 11/2003 | Takahashi |
| 7,030,551 | B2 | 4/2006 | Yamazaki et al. |
| 2002/0011978 | A1 | 1/2002 | Yamazaki et al. |
| 2005/0167573 | A1 | 8/2005 | Maruyama et al. |
| 2006/0044300 | A1 | 3/2006 | Koyama et al. |
| 2006/0186497 | A1 | 8/2006 | Nishi et al. |
| 2006/0220252 | A1* | 10/2006 | Yukawa et al. ............... 257/758 |
| 2006/0260675 | A1 | 11/2006 | Sugawara et al. |
| 2006/0261253 | A1 | 11/2006 | Arao et al. |
| 2006/0262054 | A1 | 11/2006 | Yamazaki et al. |

(Continued)

FOREIGN PATENT DOCUMENTS

EP   1 724 844   11/2006

(Continued)

OTHER PUBLICATIONS

PCT Invitation to Pay Additional Fees (PCT Applicatin No. PCT/JP2008/055173), 3 pages, mailed Apr. 22, 2008.

(Continued)

*Primary Examiner*—Victor A Mandala
*Assistant Examiner*—Whitney Moore
(74) *Attorney, Agent, or Firm*—Fish & Richardson P.C.

(57) ABSTRACT

An output terminal of a photoelectric conversion element included in the photoelectric conversion device is connected to a drain terminal and a gate terminal of a MOS transistor which is diode-connected, and a voltage $V_{out}$ generated at the gate terminal of the MOS transistor is detected in accordance with a current $I_p$ which is generated at the photoelectric conversion element. The voltage $V_{out}$ generated at the gate terminal of the MOS transistor can be directly detected, so that the range of output can be widened than a method in which an output voltage is converted into a current by connecting a load resistor, and so on.

26 Claims, 22 Drawing Sheets

U.S. PATENT DOCUMENTS

| | | |
|---|---|---|
| 2007/0045672 A1* | 3/2007 | Nishi et al. .................. 257/257 |
| 2007/0113886 A1 | 5/2007 | Arao et al. |
| 2007/0187790 A1 | 8/2007 | Takahashi et al. |
| 2007/0257248 A1 | 11/2007 | Arao et al. |
| 2008/0001148 A1 | 1/2008 | Nishi et al. |
| 2008/0078923 A1 | 4/2008 | Hirose |
| 2008/0158137 A1 | 7/2008 | Yoshida |
| 2009/0001256 A1 | 1/2009 | Yanagisawa et al. |

FOREIGN PATENT DOCUMENTS

| | | |
|---|---|---|
| JP | 03-192764 | 8/1991 |
| JP | 08-289205 | 11/1996 |
| JP | 3444093 | 9/2003 |
| JP | 2006-352098 | 12/2006 |

OTHER PUBLICATIONS

PCT Invitation to Pay Additional Fees (PCT Application No. PCT/JP2008/055173), International Searching Authority, 3 pages, mailed Apr. 22, 2008.

* cited by examiner

PHOTOELECTRIC CONVERSION DEVICE AND ELECTRONIC DEVICE PROVIDED WITH THE PHOTOELECTRIC CONVERSION DEVICE

TECHNICAL FIELD

The present invention relates to a photoelectric conversion device, and particularly relates to a photoelectric conversion device including thin film semiconductor elements. In addition, the present invention relates to electronic devices provided with the photoelectric conversion devices.

BACKGROUND ART

A number of photoelectric conversion devices used for detecting an electromagnetic wave are generally known, and for example, photoelectric conversion devices having sensitivity from ultra violet rays to infrared rays are collectively referred to as optical sensors. Among them, an optical sensor having sensitivity in a visible light region with a wavelength of 400 to 700 nm is particularly referred to as a visible light sensor, and a large number of visible light sensors are used for devices which need illuminance adjustment, on/off control, or the like depending on human living environment.

In some display devices, ambient brightness of the display device is detected to adjust display luminance. This is because unnecessary electric power of the display device can be reduced by detecting ambient brightness by an optical sensor and obtaining appropriate display luminance. For example, examples of display devices which have an optical sensor for adjusting luminance include mobile phone and computer.

In addition, as well as the ambient brightness of the display device, luminance of the backlight of a display device, in particular, a liquid crystal display device is also detected by an optical sensor to adjust luminance of a display screen.

In an optical sensor, a photoelectric conversion element such as a photodiode or the like is used for a light sensing part, and an output current of the photoelectric conversion element is amplified in an amplifier circuit. For example, a current mirror circuit is used as the amplifier circuit of the optical sensor (for example, see Reference 1: Japanese Patent No. 3444093).

DISCLOSURE OF INVENTION

An optical sensor shown in Reference 1 can detect weak light by providing a circuit for amplifying the photocurrent. However, when light from weak light to strong light is detected, the range of output current becomes wider, and output voltage increases in linear proportion to illuminance in the case that the output current is converted into voltage by an external load resistor or the like. Accordingly, when the output voltage is obtained to the wide range of illuminance, the output voltage with respect to illuminance is several mV for weak light and is several V for strong light. Therefore, there is a problem that wide dynamic range cannot be obtained In order to solve the above-described problem, the present inventors have come up with the idea of a structure which is totally different form the structure where weak light is detected by providing a circuit for amplifying the photocurrent. A photoelectric conversion device of the present invention has a structure that an output terminal of a photoelectric conversion element is connected to a drain terminal and gate terminal of a field effect transistor which is diode-connected, and voltage $V_{out}$ which is generated at the gate terminal of the field effect transistor is detected in accordance with current $I_p$ which is generated at the photoelectric conversion element. By a structure that the voltage $V_{out}$ which is generated at the gate terminal of the field effect transistor is directly detected, the range of the output voltage can be widened compared to a method in which the output voltage is converted into a current by connecting a load resistor, and the like.

One aspect of the present invention is that the photoelectric conversion device includes a photoelectric conversion circuit including a photoelectric conversion element and a field effect transistor, a DC power supply including a high potential terminal and a low potential terminal, and a voltage detection circuit. A cathode of the photoelectric conversion element is connected to the high potential terminal; an anode of the photoelectric conversion element is connected to a drain terminal and a gate terminal of the field effect transistor; a source terminal of the field effect transistor is connected to the low potential terminal; and the anode of the photoelectric conversion element, the drain terminal of the field effect transistor, and the gate electrode of the field effect transistor are connected to the voltage detection circuit.

Another aspect of the present invention is that a photoelectric conversion device includes a photoelectric conversion circuit including a photoelectric conversion element and a field effect transistor, a DC power supply including a high potential terminal and a low potential terminal, a voltage detection circuit, and an amplifier circuit. A cathode of the photoelectric conversion element is connected to the high potential terminal; an anode of the photoelectric conversion element is connected to a drain terminal and a gate terminal of the field effect transistor via the amplifier circuit; a source terminal of the field effect transistor is connected to the low potential terminal; and the drain terminal of the field effect transistor and the gate terminal of the field effect transistor are connected to the voltage detection circuit.

By the photoelectric conversion device of the present invention, the photocurrent generated at the photoelectric conversion element can be converted into voltage with a structure simpler than the structure in which a circuit for amplifying photocurrent is provided. Therefore, the dynamic range of an optical sensor can be widened compared to the structure in which the output voltage increases in linear proportion to illuminance.

BEST MODE FOR CARRYING OUT THE INVENTION

Figure 1:
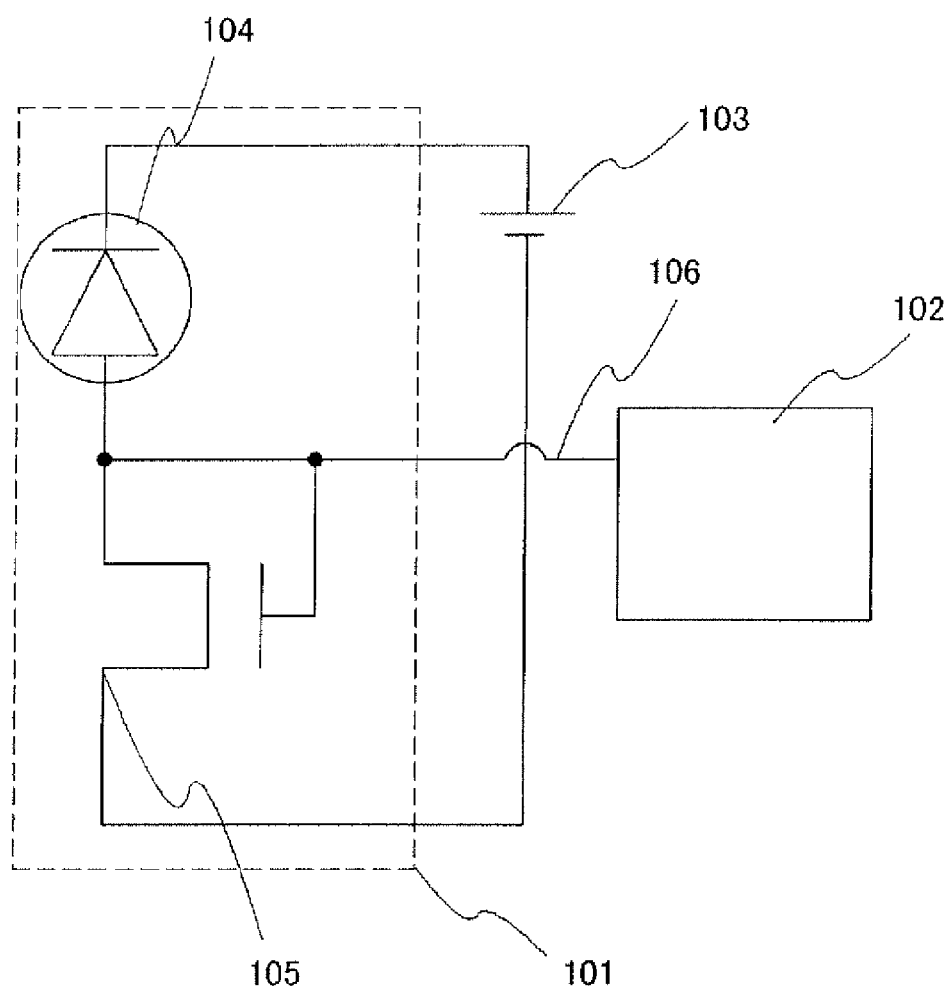
FIG. 1 is a diagram showing Embodiment Mode 1 of the present invention.

Hereinafter, embodiment modes of the present invention will be described with reference to the accompanying drawings. However, the present invention can be implemented in various modes. As can be easily understood by a person skilled in the art, the modes and details of the present invention can be changed in various ways without departing from the spirit and scope of the present invention. Thus, the present invention should not be interpreted as being limited to the following description of the embodiment modes. Through the drawings of the embodiment modes, the same components or components having similar functions are denoted by the same reference numerals and will not be further explained.

Embodiment Mode 1

This embodiment mode will be described with reference to FIG. 1. A photoelectric conversion device shown in FIG. 1 includes a photoelectric conversion circuit 101, a voltage detection circuit 102, and a DC power supply 103. The photoelectric conversion circuit 101 includes a photoelectric conversion element 104 and an n-channel transistor 105. A first terminal (also referred to as an input terminal or a cathode) which is a cathode of the photoelectric conversion element 104 is connected to a high potential terminal (also referred to as a first terminal) of the DC power supply 103. In addition, a second terminal (also referred to as an output terminal or an anode) which is an anode of the photoelectric conversion element 104 is connected to a drain terminal and a gate terminal of the n-channel transistor 105. Note that the second terminal of the photoelectric conversion element 104 is connected to the voltage detection circuit 102 as an output terminal 106 of the photoelectric conversion circuit 101. Note that the reverse bias voltage is applied to the photoelectric conversion element 104 by the DC power supply 103. In addition, a source terminal of the n-channel transistor 105 is connected to a low potential terminal (also referred to as a second terminal) of the DC power supply 103.

Note that description is made, where the "connection" is defined as electrical connection in this specification.

The operation of the photoelectric conversion circuit 101 shown in FIG. 1 is described. In the photoelectric conversion circuit 101, a photocurrent $I_p$ is generated corresponding to the intensity of light which enters the photoelectric conversion element 104. Then, the photocurrent $I_p$ which is generated at the photoelectric conversion element 104 passes between the drain terminal and the source terminal of the n-channel transistor 105, so that voltage which is applied between the gate terminal and the source terminal (hereinafter, abbreviated as gate voltage $V_{gs}$) is generated at the n-channel transistor 105 corresponding to the photocurrent $I_p$. The source terminal of the n-channel transistor 105 is connected to a low potential terminal of the DC power supply 103, and potential of the gate terminal of the n-channel transistor 105 can be taken out as the output voltage $V_{out}$. Therefore, the photoelectric conversion circuit 101 can conduct current-voltage conversion of the photocurrent $I_p$ and the output voltage $V_{out}$.

Note that the output voltage $V_{out}$ which is generated by flow of the photocurrent $I_p$ from the photoelectric conversion element 104 through the n-channel transistor 105 depends on a state of the operation of the n-channel transistor 105. The state of the operation of the n-channel transistor 105 can be described with a state of the operation of the field effect transistor. Examples of the field effect transistor include a metal oxide semiconductor field effect transistor (hereinafter, referred to as a MOS transistor), an insulated gate type FET, a thin film transistor, and the like. In this specification, an operation of a MOS transistor as a field effect transistor will be described in detail below. When the MOS transistor operates in a saturation region, relations of a drain current $I_d$ and the gate voltage $V_{gs}$ are expressed by Equation 1 and Equation 2.

$$Id = \frac{\beta(Vgs - Vth)^2}{2} \quad \text{Equation 1}$$

$$\beta = \frac{\mu Cox W}{L} \quad \text{Equation 2}$$

In Equation 1, $V_{th}$ is threshold voltage of the MOS transistor, and β is a constant which is determined depending on size and process conditions of the MOS transistor. In addition, in Equation 2, W represents the gate width of the MOS transistor, L represents the gate length of the MOS transistor, μ represents electron mobility in a semiconductor layer, and Cox represents gate capacitance which is generated in a stacked structure in which an insulating film is sandwiched between the semiconductor layer and the gate electrode.

The output voltage $V_{out}$ in the circuit shown in FIG. 1 of this embodiment mode can be treated as the gate voltage $V_{gs}$ in Equation 1. The photocurrent $I_p$ in the circuit of FIG. 1 can be treated as a drain current $I_d$ in Equation 1. Accordingly, by transforming Equation 1, the relation between the photocurrent $I_p$ and the output voltage $V_{out}$ can be expressed by Equation 3.

$$Vout = \sqrt{\frac{2Ip}{\beta}} + Vth \qquad \text{Equation 3}$$

Note that in the case of the n-channel transistor 105 in which the drain terminal and the gate terminal are electrically connected (diode-connected), the voltage applied between the drain terminal and the source terminal (hereinafter, abbreviated as drain voltage $V_{ds}$) is equivalent to the gate voltage $V_{gs}$. Accordingly, when the drain current $I_d$ increases, the output voltage $V_{out}$ of the photoelectric conversion circuit shown in this embodiment mode can be obtained in the form of the square root of the photocurrent $I_p$ which passes through the photoelectric conversion element 104. Then, the dynamic range of detectable input illuminance of the photoelectric conversion device of the present invention can be widened compared to the case that the photoelectricity $I_p$ generated in the photoelectric conversion element passes through the load resistor to obtain the voltage output. In addition, since the photoelectric conversion device of the present invention can be manufactured with only MOS transistors having one polarity, the number of masks and the period for manufacturing process can be reduced compared to a structure that uses a photoelectric conversion circuit configured by an operational amplifier or the like, whereby cost can be reduced. In addition, since the number of MOS transistors which are field effect transistors included in the photoelectric conversion circuit and the packaging area can be reduced, the size of the device can be reduced. Miniaturization of a part like an optical sensor provided with a photoelectric conversion circuit is effective particularly when the component is used for portable electronic devices.

In addition, when the photoelectric conversion element 104 is irradiated with low illuminance light, enough photocurrent $I_p$ for operating the n-channel transistor 105 in a saturation region is not supplied from the photoelectric conversion element 104 to the n-channel transistor 105 in some case. When enough photocurrent $I_p$ for operating the n-channel transistor 105 in the saturation region is not supplied, the n-channel transistor 105 operates in a subthreshold (weak inversion) region. The relation between the drain current $I_d$ and the gate voltage $V_{gs}$ of the MOS transistor at the operation in the subthreshold region is expressed by the following Equations 4, 5 and 6.

$$Id = Idd \exp\left[\frac{q}{nkT}(Vgs - Vth)\right] \qquad \text{Equation 4}$$

$$Idd = \frac{W\mu Cox}{nL}\left(\frac{nkT}{q}\right)^2 \exp(-1) \qquad \text{Equation 5}$$

$$n = \frac{Cox + Cd}{Cox} \qquad \text{Equation 6}$$

In Equations 4, 5 and 6, k represents a Boltzmann constant, T represents a temperature of the semiconductor layer, q represents elementary electric charge in the semiconductor layer, and Cd represents capacitance of depletion layer in the semiconductor layer.

The output voltage $V_{out}$ in the circuit shown in FIG. 1 of this embodiment mode can be treated as the gate voltage $V_{gs}$ in Equation 4. The photocurrent $I_p$ in the circuit of FIG. 1 can be treated as a drain current $I_d$ in Equation 4. Accordingly, by transforming Equation 4, the relation of the photocurrent $I_p$ and the output voltage $V_{out}$ can be expressed by Equation 7.

$$Vout = Vth + \frac{nkT}{q}\ln\left(\frac{Ip}{Idd}\right) \qquad \text{Equation 7}$$

As shown in Equation 7, the output voltage $V_{out}$ of the photoelectric conversion circuit shown in this embodiment mode can be obtained in the form of the logarithm of the photocurrent $I_p$. Then, the dynamic range of detectable input illuminance of the photoelectric conversion device of the present invention can be widened compared to the case that the phoelectricity $I_p$ generated in the photoelectric conversion element passes through the load resistor to obtain the voltage output.

Note that detection of the output voltage $V_{out}$ using the n-channel transistor 105 of the photoelectric conversion device shown in FIG. 1 may be conducted in which case of using the operation in the saturation region or using the operation in the subthreshold region, and it is not limited to one of the detections.

Figure 2:
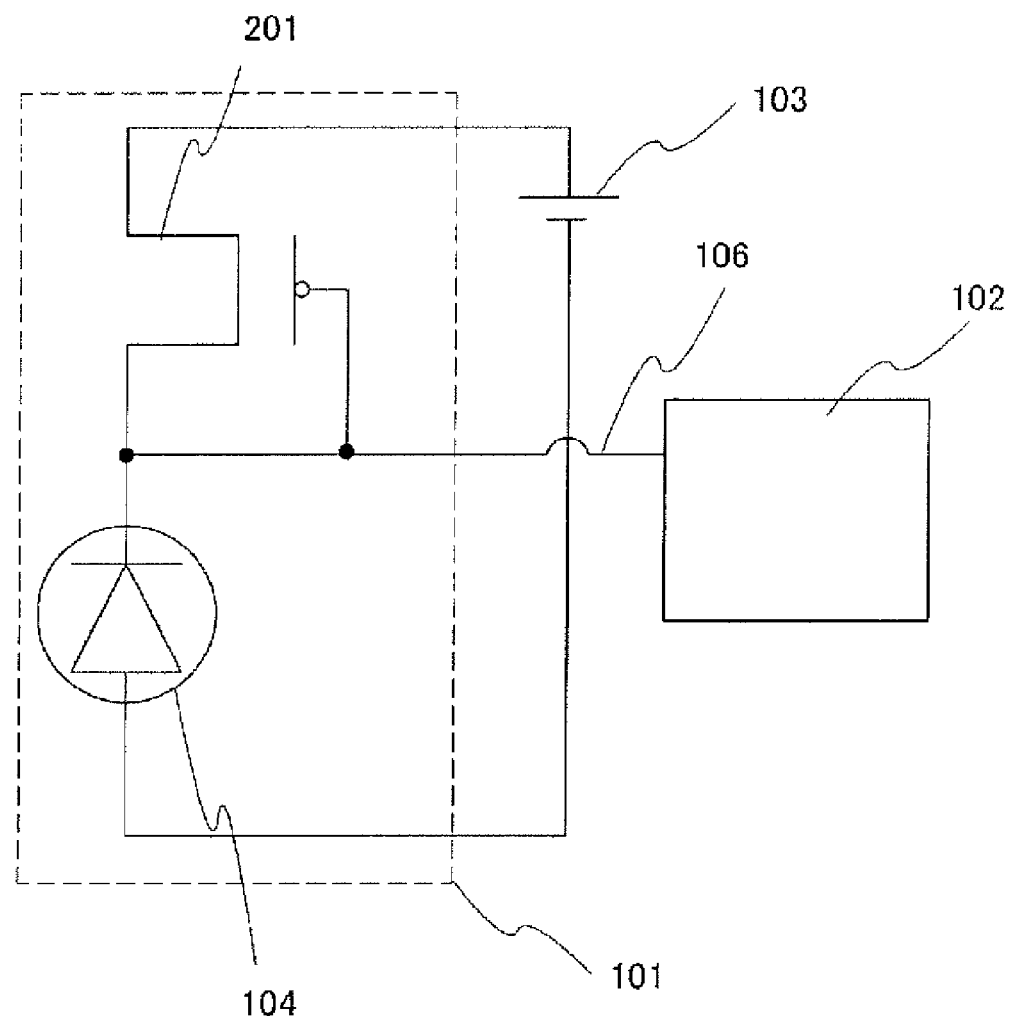
FIG. 2 is a diagram showing Embodiment Mode 1 of the present invention.

Note that in the photoelectric conversion device shown in FIG. 1, a p-channel transistor can be provided instead of the n-channel transistor 105. FIG. 2 shows an equivalent circuit in which the p-channel transistor replaces the n-channel transistor 105 of the photoelectric conversion device shown in FIG. 1. A photoelectric conversion device shown in FIG. 2 includes the photoelectric conversion circuit 101, the voltage detection circuit 102, and the DC power supply 103. The photoelectric conversion circuit 101 shown in FIG. 2 includes the photoelectric conversion element 104 and a p-channel transistor 201. A source terminal of the p-channel transistor 201 is connected to a high potential terminal of the DC power supply 103. A drain terminal and a gate terminal of the p-channel transistor 201 are connected to a first terminal which is a cathode of the photoelectric conversion element 104. The first terminal of the photoelectric conversion element 104 is connected to the voltage detection circuit 102 as the output terminal 106. A second terminal which is an anode of the photoelectric conversion element 104 is connected to the low potential terminal of the DC power supply 103. Note that the reverse bias voltage is applied to the photoelectric conversion element 104 by the DC power supply 103.

Note that as for the foregoing voltage detection circuit 102, a structure may be employed, in which an AD converter or the like is provided separately as an external circuit so that the output voltage $V_{out}$ is detected. Note that the AD converter and the photoelectric conversion circuit 101 can be formed using thin film transistors over the same substrate.

Figure 3A:
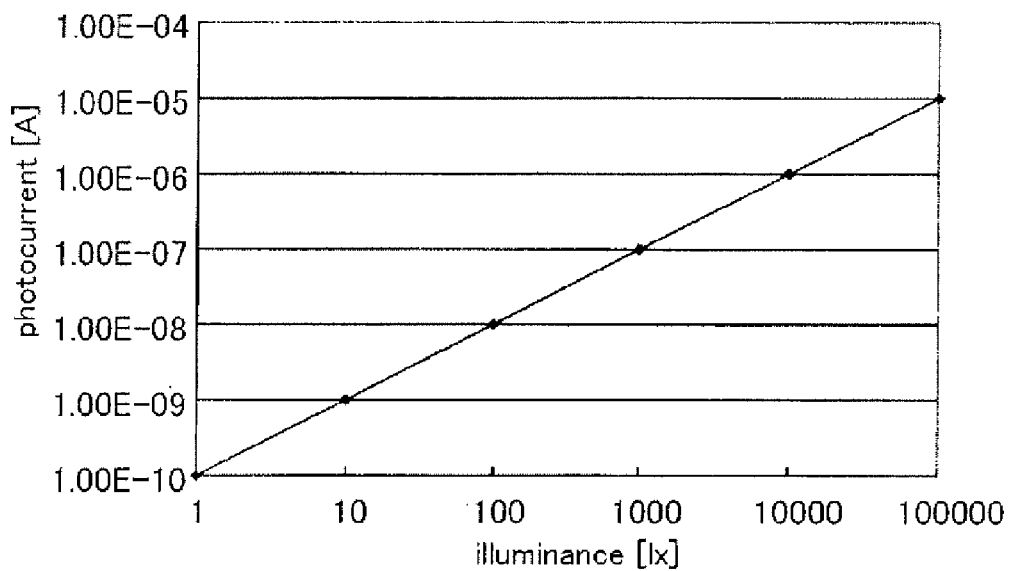
FIGS. 3A and 3B are characteristic diagrams in which an output characteristic of a conventional circuit and that of Embodiment Mode 1 of the present invention are compared.
Figure 3B:
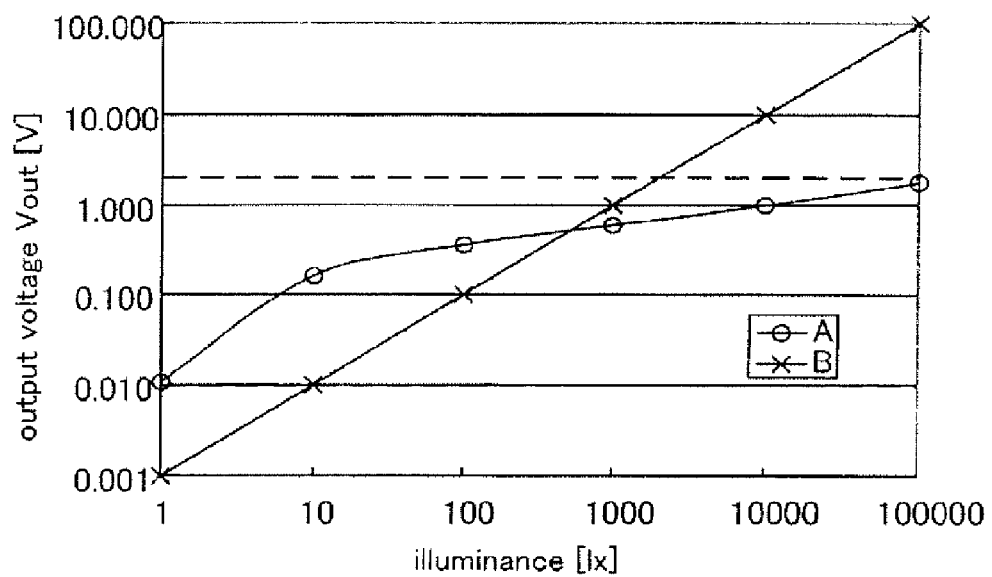
Figure 5:
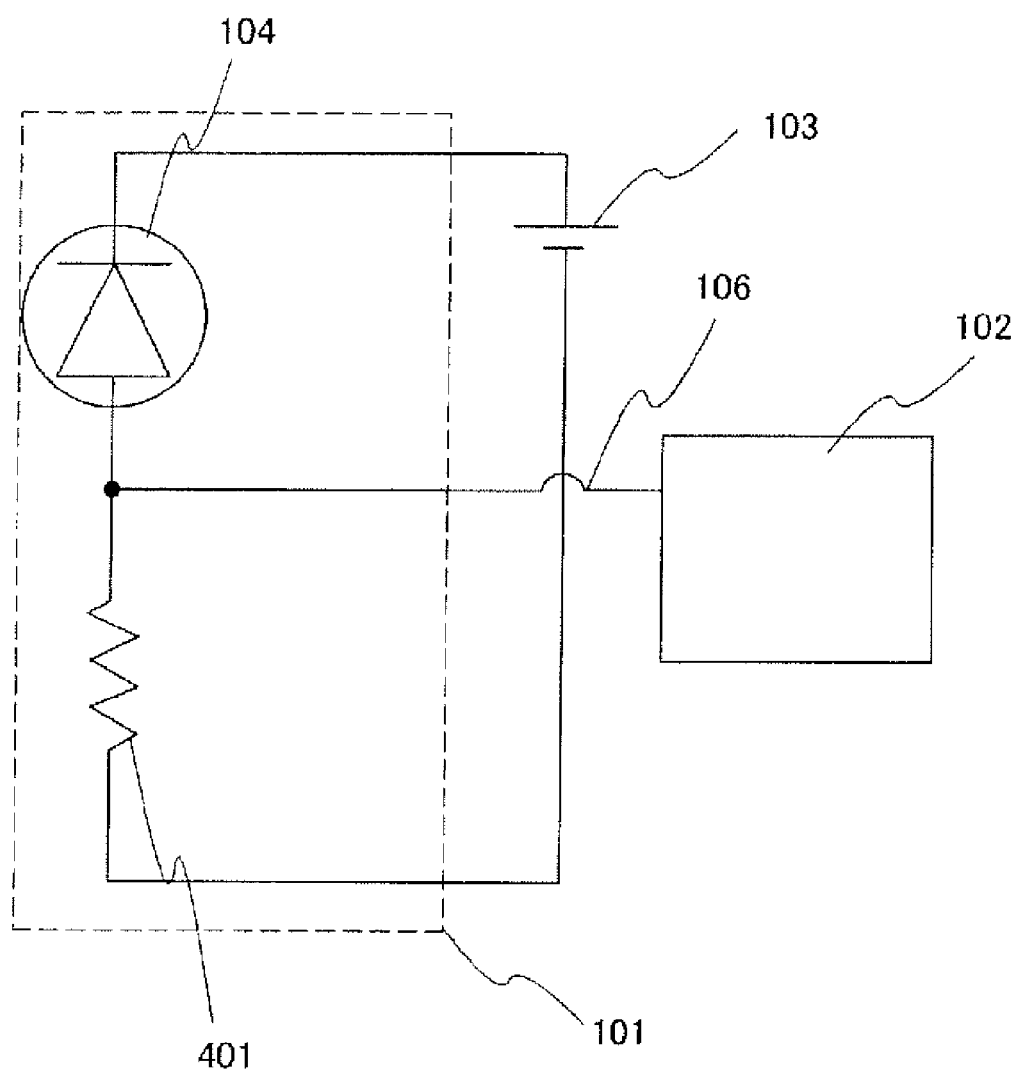
FIG. 5 is a diagram showing a conventional photoelectric conversion device.

FIG. 3B is a graph showing comparison of the relation between the illuminance and the output voltage as a result of the simulating a circuit shown in FIG. 1 of Embodiment Mode 1 and a conventional circuit in which the photocurrent is converted into the output voltage $V_{out}$ by a load resistor 401 shown in FIG. 5. Note that the photoelectric conversion element has a relation as illustrated in FIG. 3A that when the illuminance to be incident increases, the amount of the photocurrent also increases linearly. In the graph of FIG. 3B, the output voltages 0.01 V and 2 V are illustrated with dotted lines, and is an exemplary range of the analog input voltage in the case that an AD converter IC in which the AD converter IC operates at the voltage of 3 V of the DC power supply, and an analog signal is converted into a digital signal of 8 bit is used as the voltage detection circuit 102. The output voltage of the photoelectric conversion circuit shown in FIG. 1 of this embodiment mode which is illustrated with a characteristic A (plotted with circles) in the graph of FIG. 3B is in the range of 0.01 V to 2 V, which are illustrated with dotted lines, with respect to the range of the input voltage of 1 lx to 100 klx. On the contrary, as for the output voltage of the photoelectric conversion circuit by the load resistor shown in FIG. 5 which is illustrated with a characteristic B (plotted with x marks) in the graph of FIG. 3B, only the range of about three digits of from 10 lx to 1 klx is in the range of the output voltage illustrated with the dotted lines. That is, the dynamic range of input illuminance for the photoelectric conversion element can be widened by the photoelectric conversion circuit of the present invention shown in FIG. 1 of this embodiment mode.

Note that in the graph showing comparison of the relation between the illuminance and the output voltage in FIG. 3B, the operation of the n-channel transistor 105 includes both the operation in the subthreshold region and the operation in the saturation region in outputting the output voltage $V_{out}$. Specifically, in the case that illuminance is equal to or higher than 10 lx, the n-channel transistor 105 operates in the saturation region, and in the case that illuminance is equal to or lower than 10 lx, the n-channel transistor 105 operates in the subthreshold region in the graph of FIG. 3B. Therefore, a comparator circuit which determines whether the n-channel transistor 105 operates in the saturation region or the subthreshold region can be provided in advance for the voltage detection circuit 102 of the photoelectric conversion device shown in FIG. 1, and the output voltage can be obtained by switching the operation between the saturation region and the subthreshold region according to need. By providing a comparator circuit which determine whether the n-channel transistor 105 operates the saturation region or in the subthreshold region in advance for the voltage detection circuit 102, the voltage detection circuit 102 can determine which region the output voltage comes from, whereby a photoelectric conversion device with low malfunction can be achieved.

Figure 4A:
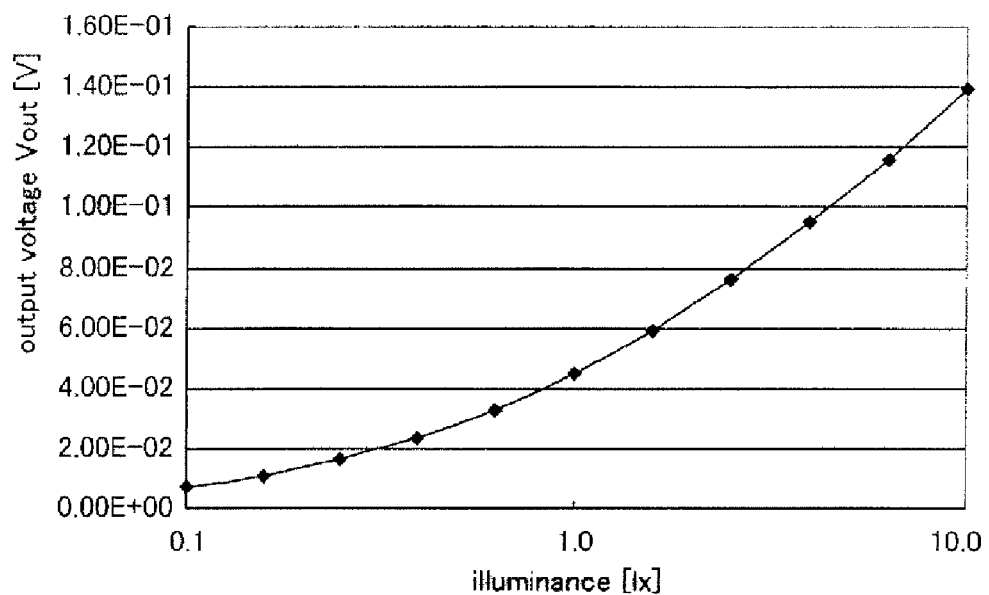
FIGS. 4A and 4B are characteristic diagrams showing output characteristics of Embodiment Mode 1 of the present invention.
Figure 4B:
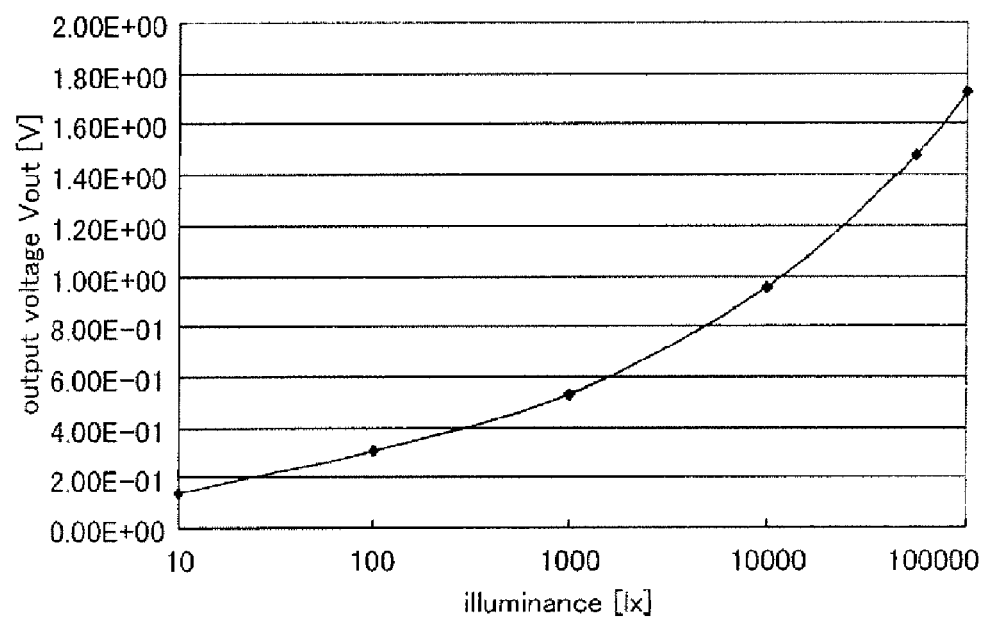

FIG. 4A is a characteristic diagram showing the relation between the illuminance and the output voltage as a result of simulating a photoelectric conversion circuit shown in FIG. 1 of Embodiment Mode 1 in the case that the active region of the n-channel transistor 105 is the subthreshold region. In addition, FIG. 4B is a characteristic diagram showing the relation between the illuminance and the output voltage as a result of simulating a photoelectric conversion circuit shown in FIG. 1 of Embodiment Mode 1 in the case that the active region of the n-channel transistor 105 is the saturation region. Note that as shown in FIGS. 4A and 4B, when the n-channel transistor 105 operates in either the subthreshold region or the saturation region, a comparator circuit which determines whether the n-channel transistor 105 operates in the saturation region or the subthreshold region is not necessarily provided for the voltage detection circuit 102, unlike the case described above. Therefore, a comparator circuit is not necessarily provided, so that the size of the photoelectric conversion circuit can be reduced.

Various types of field effect transistors can be employed as the n-channel transistor and the p-channel transistor described in this embodiment mode. Therefore, there is no limitation on the kinds of transistors to be used. For example, a thin film transistor (a TFT) including a film of non-single crystalline semiconductor typified by amorphous silicon, polycrystalline silicon, microcrystalline (also referred to as semi-amorphous) silicon, or the like can be employed. In the case of using the TFT, there are various advantages. For example, since the TFT can be formed at a temperature lower than that of the case of using single crystalline silicon, manufacturing cost can be reduced and a manufacturing device can be made larger. Since the manufacturing device can be made larger, the TFT can be formed using a large substrate. Therefore, since many photoelectric conversion devices can be formed at the same time, the TFT can be formed at low cost. In addition, a substrate having low heat resistance can be used because of low manufacturing temperature. Therefore, the transistor can be formed over a light-transmitting substrate. Further, transmission of light in a photoelectric conversion element can be controlled by using the transistor formed over the light-transmitting substrate.

Note that by using a catalyst (e.g., nickel) in the case of forming polycrystalline silicon, crystallinity can be further improved, and a transistor having excellent electric characteristics can be formed. As a result, a circuit which is required to operate at a high speed can be formed over the one substrate. Note that by using a catalyst (e.g., nickel) in the case of forming microcrystalline silicon, crystallinity can be further improved and a transistor having excellent electric characteristics can be formed. At this time, crystallinity can be improved by performing heat treatment without laser irradiation. In the case of not using a laser for crystallization, crystallinity unevenness of silicon can be suppressed. Therefore, variation in characteristics among transistors can be reduced. Note that polycrystalline silicon and microcrystalline silicon can be formed without using a catalyst (e.g., nickel).

In addition, transistors can be formed by using a semiconductor substrate, an SOI substrate, or the like. Therefore, transistors with little variations in characteristics, size, shape, or the like, with high current supply capacity, and with a small size can be formed. By using such transistors, power consumption of a circuit can be reduced or a circuit can be highly integrated.

In addition, a transistor including a compound semiconductor or an oxide semiconductor such as ZnO, a-InGaZnO, SiGe, GaAs, IZO, ITO, or SnO, and a thin film transistor or the like obtained by thinning such a compound semiconductor or an oxide semiconductor can be used. Therefore, manufacturing temperature can be lowered and for example, such a transistor can be formed at room temperature. Accordingly, the transistor can be formed directly on a substrate having low heat resistance such as a plastic substrate or a film substrate.

A transistor or the like formed by using an inkjet method or a printing method can also be used. Accordingly, a transistor can be formed at room temperature, can be formed at a low vacuum, or can be formed using a large substrate. In addition, since the transistor can be formed without using a mask (a reticle), layout of the transistor can be easily changed. Further, since it is not necessary to use a resist, material cost is reduced and the number of steps can be reduced. Furthermore, since a film is formed only in a necessary portion, a material is not wasted compared with a manufacturing method in which etching is performed after the film is formed over the entire surface, so that cost can be reduced.

Various types of field effect transistors can be used and be formed using various types of substrates. Accordingly, all of the circuits which are necessary to realize a given function can be formed over the same substrate. For example, all of the circuits which are necessary to realize a given function can be formed over a glass substrate, a plastic substrate, a single crystalline substrate, an SOI substrate, or any of the other substrates. Note that the photoelectric conversion device of this embodiment mode can be formed over a light-transmitting substrate such as a glass substrate by forming a field effect transistor using a thin film transistor Therefore, when the photoelectric conversion element 104 is formed over the substrate, not only the light from top surface side but also the light transmitted through the substrate from the rear side of the substrate can be received by the photoelectric conversion element 104, whereby it is effective to enhance the efficiency of light reception.

Note that this embodiment mode can be implemented by being combined with any technical elements in other embodiment modes of this specification.

Embodiment Mode 2

Embodiment Mode 2 of the present invention, which has a different structure from the photoelectric conversion device described in the above embodiment mode, will be described with reference to FIG. 6. A photoelectric conversion device described in this embodiment mode includes the photoelectric conversion circuit 101, the voltage detection circuit 102, and the DC power supply 103. The difference from the photoelectric conversion circuit described with reference to FIG. 1 in Embodiment Mode 1 is that the photoelectric conversion circuit 101 has a current amplifier 501 between the photoelectric conversion element 104 and the n-channel transistor 105. The first terminal which is a cathode of the photoelectric conversion element 104 is connected to the high potential terminal of the DC power supply 103. The second terminal which is an anode of the photoelectric conversion element 104 is connected to an input terminal of the current amplifier 501. An output terminal of the current amplifier 501 is connected to the drain terminal and the gate terminal of the n-channel transistor 105. The drain terminal and the gate terminal of the n-channel transistor 105 are connected to the voltage detection circuit 102 as the output terminal 106 of the photoelectric conversion circuit 101. The reverse bias voltage is applied to the photoelectric conversion element 104 by the DC power supply 103. In addition, the source terminal of the n-channel transistor 105 is connected to the low potential terminal of the DC power supply 103.

Figure 6:
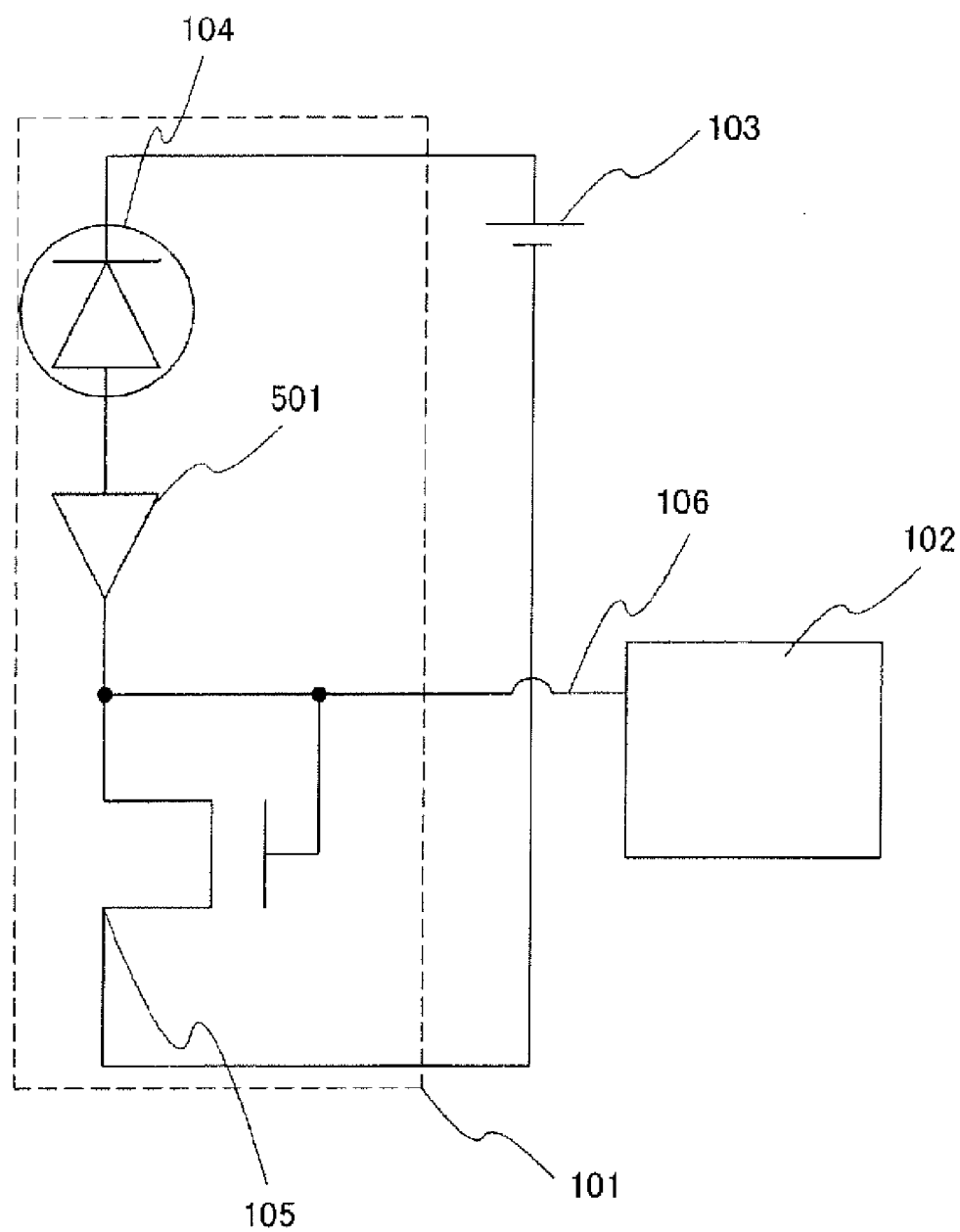
FIG. 6 is a diagram showing Embodiment Mode 2 of the present invention.

In the structure shown in FIG. 6, since the photocurrent $I_p$ generated at the photoelectric conversion element 104 can be amplified in advance by adding the current amplifier 501, the photocurrent $I_p$ can be amplified to a current value of which enough output voltage $V_{out}$ can be obtained at the n-channel transistor 105 even when the photocurrent $I_p$ is extremely weak. Therefore, there is an advantageous effect that the obtainable amount of photocurrent $I_p$ with the same light reception area can be increased by adding the current amplifier 501, without enlarging the light reception area of the photoelectric conversion element 104 for increase of the photocurrent $I_p$.

Note that by making the current amplifier 501 have a simple structure using a current mirror circuit which can be formed with a field effect transistor having the same conductivity type as the field effect transistor for obtaining the output voltage $V_{out}$, the current amplifier 501 can be prevented from being affected by variation of circuits.

Figure 7:
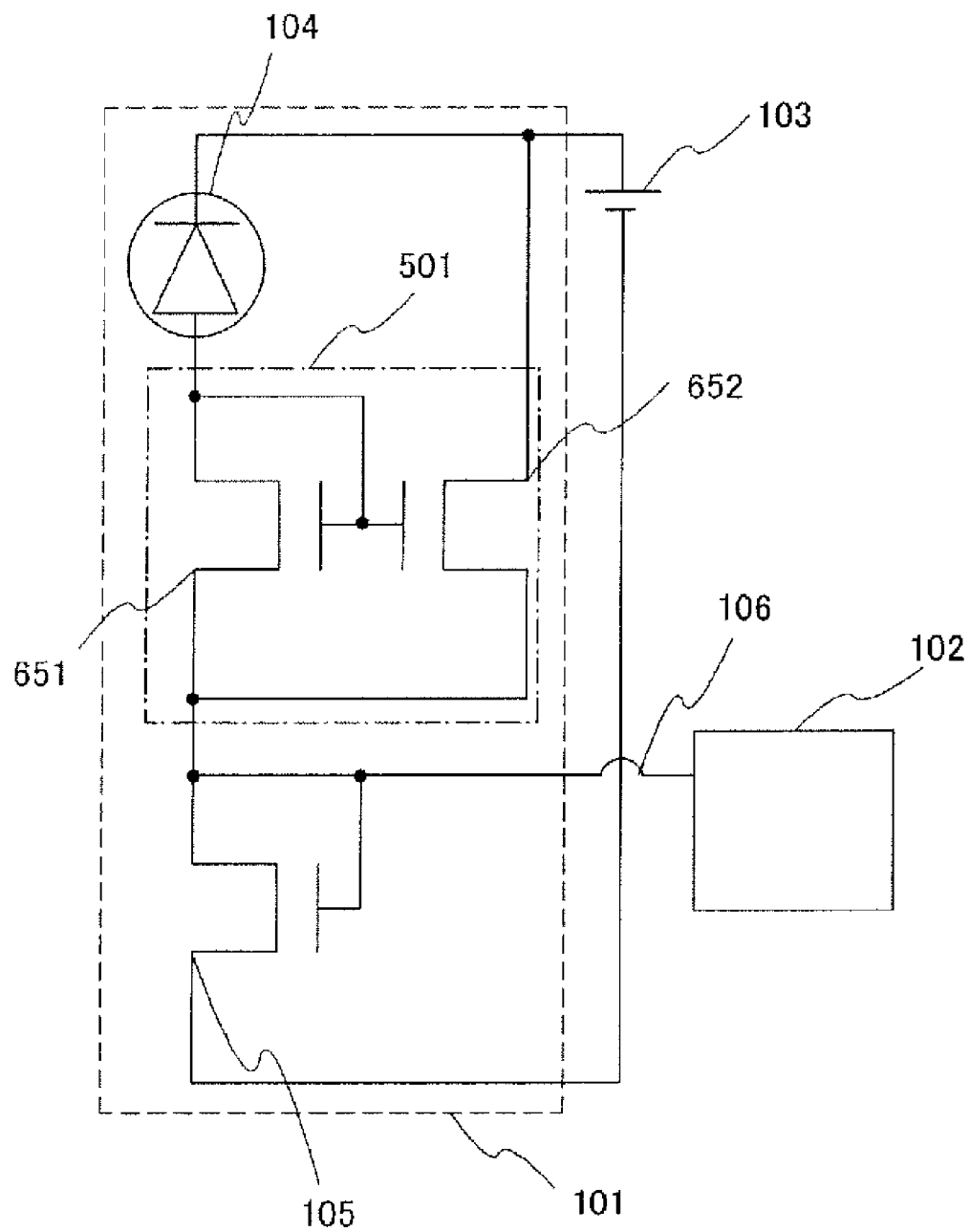
FIG. 7 is a diagram showing the detail of Embodiment Mode 2 of the present invention.

FIG. 7 is an example in the case that the current amplifier 501 shown in FIG. 6 is configured using a current mirror circuit. The photoelectric conversion circuit 101 includes a first n-channel transistor 651 and a second n-channel transistor 652. A drain terminal and a gate terminal of the first n-channel transistor 651 are connected to a gate terminal of the second n-channel transistor 652 and a second terminal which is an anode of the photoelectric conversion element 104. In addition, a source terminal of the first n-channel transistor 651 and a source terminal of the second n-channel transistor 652 are connected to the drain terminal and the gate terminal of the n-channel transistor 105. The source terminal of the first n-channel transistor 651 and the source terminal of the second n-channel transistor 652 are connected to the voltage detection circuit 102 as the output terminal 106 of the photoelectric conversion circuit 101. In addition, a drain terminal of the second n-channel transistor 652 is connected to the first terminal which is a cathode of the photoelectric conversion element 104 and the high potential terminal of the DC power supply 103. The source terminal of the n-channel transistor 105 is connected to the low potential terminal of the DC power supply 103.

Figure 8:
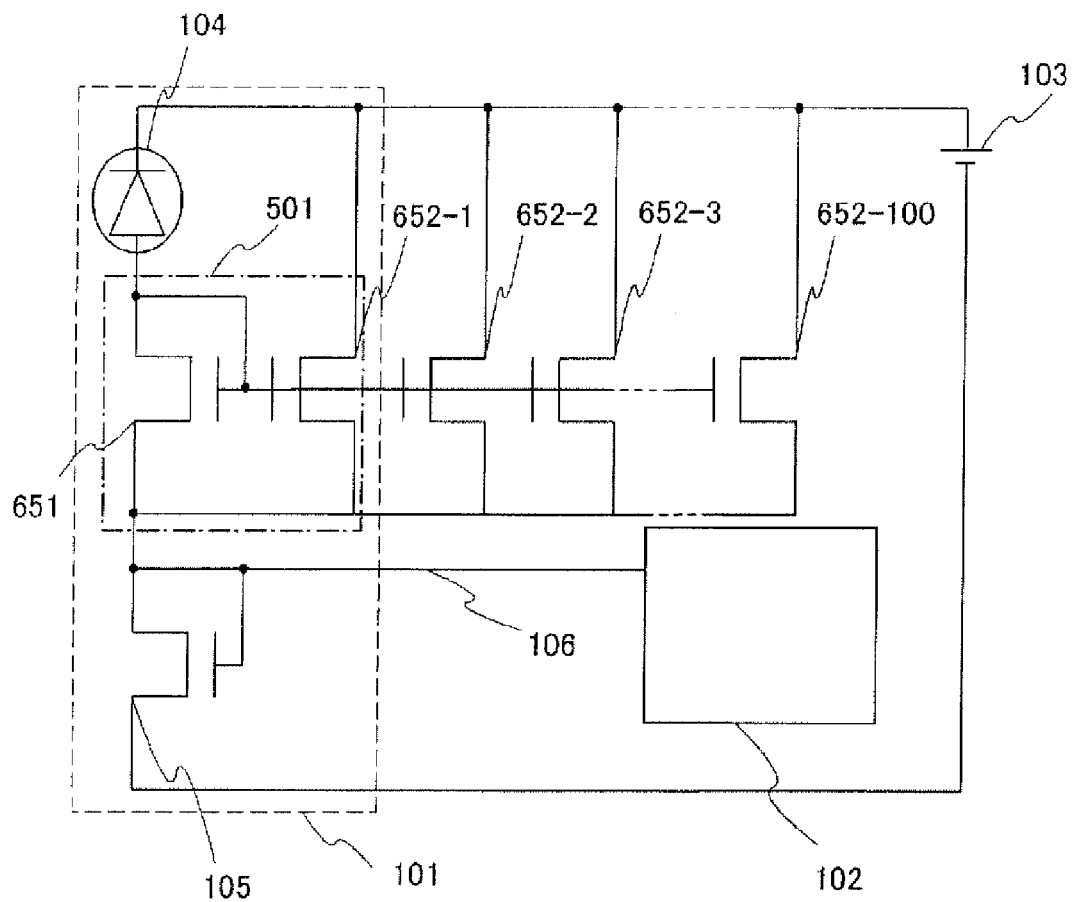
FIG. 8 is a diagram showing a modification example of Embodiment Mode 2 of the present invention.

FIG. 7 shows a current mirror circuit using two n-channel transistors, and has the described structure in which the amount of photocurrent $I_p$ input to the current amplifier 501 from the photoelectric conversion element 104 is amplified two times to be output. FIG. 8 shows a structure in which a plurality of the n-channel transistors 652 are connected in parallel in a current mirror circuit included in the current amplifier 501 so that the current amplification factor is increased. In FIG. 8, the number of the plural the n-channel transistors 652 included in the current amplifier 501 is, for example, one first n-channel transistor 651 and hundred second n-channel transistors 652 when the output value of the photocurrent $I_p$ is to be hundredfold. In FIG. 8, as the hundred n-channel transistors 652, the n-channel transistors 652-1, 652-2, 652-3, to 652-100, are provided. Accordingly, the amount of the photocurrent $I_p$ generated at the photoelectric conversion element 104 is amplified hundred times, and the photocurrent $I_p$ is output.

Note that description is made by using the n-channel transistors as an example of the field effect transistor included in the photoelectric conversion device in FIGS. 6 to 8; however, p-channel transistors can be included in the photoelectric conversion device of the present invention.

Note that this embodiment mode can be implemented by being combined with any technical elements in other embodiment modes of this specification.

Embodiment Mode 3

Figure 9:
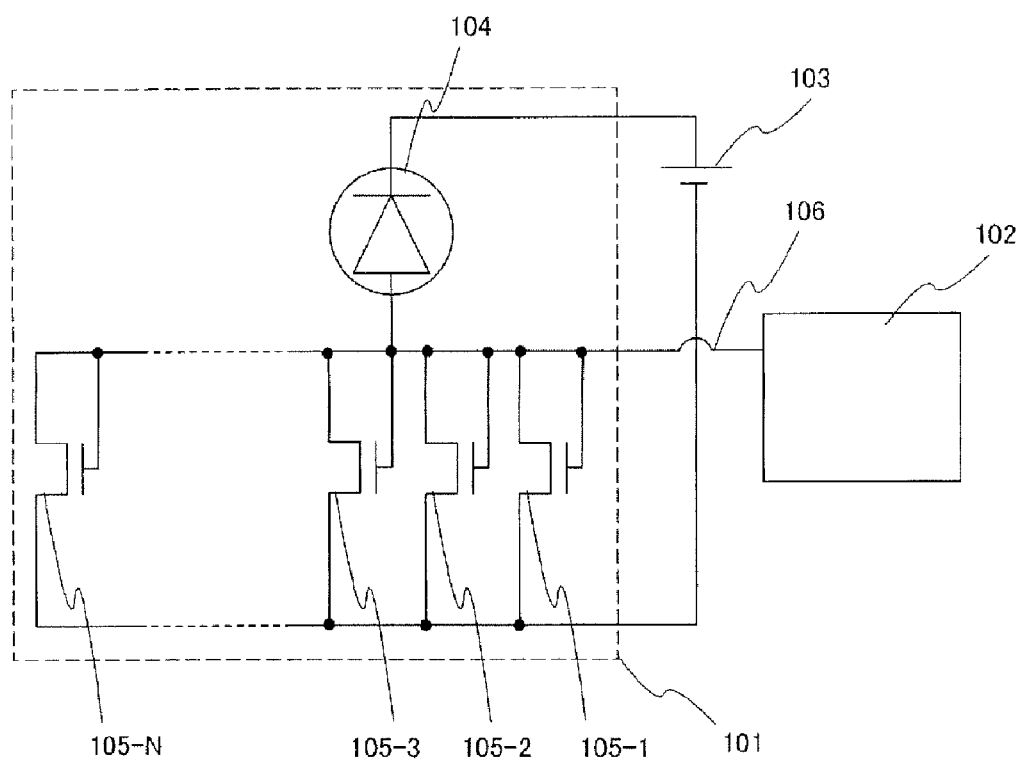
FIG. 9 is a diagram showing Embodiment Mode 3 of the present invention.

Embodiment Mode 3 of the present invention will be described with reference to FIG. 9. This embodiment mode differs from the photoelectric conversion device of Embodiment Mode 1 in FIG. 1 in that a plurality of the n-channel transistors 105, such as the n-channel transistors 105-1, 105-2, 105-3, to 105-N (N is a natural number), are included in the photoelectric conversion circuit shown in this embodiment mode while one n-channel transistor 105 is included in the photoelectric conversion circuit in FIG. 1.

The n-channel transistor 105 is a circuit for converting the photocurrent $I_p$ into the output voltage $V_{out}$ in the photoelectric conversion circuit 101, and the characteristics of the n-channel transistor 105 may vary due to various factors in the manufacturing steps in some cases. Even when the same amount of the photocurrent $I_p$ is input, the level of the output voltage $V_{out}$ changes due to the variation of the characteristics, and there is a possibility of a problem that the photoelectric conversion device with high yield cannot be manufactured. Thus, the n-channel transistor 105 included in the photoelectric conversion circuit is provided with a plurality of the n-channel transistors 105-1, 105-2, 105-3, to 105-N as shown in this embodiment mode, so that the percentage of the effect on the output voltage $V_{out}$ from the variation of one n-channel transistor can be small. Therefore, the yield in manufacturing the photoelectric conversion device can be increased.

Figure 10:
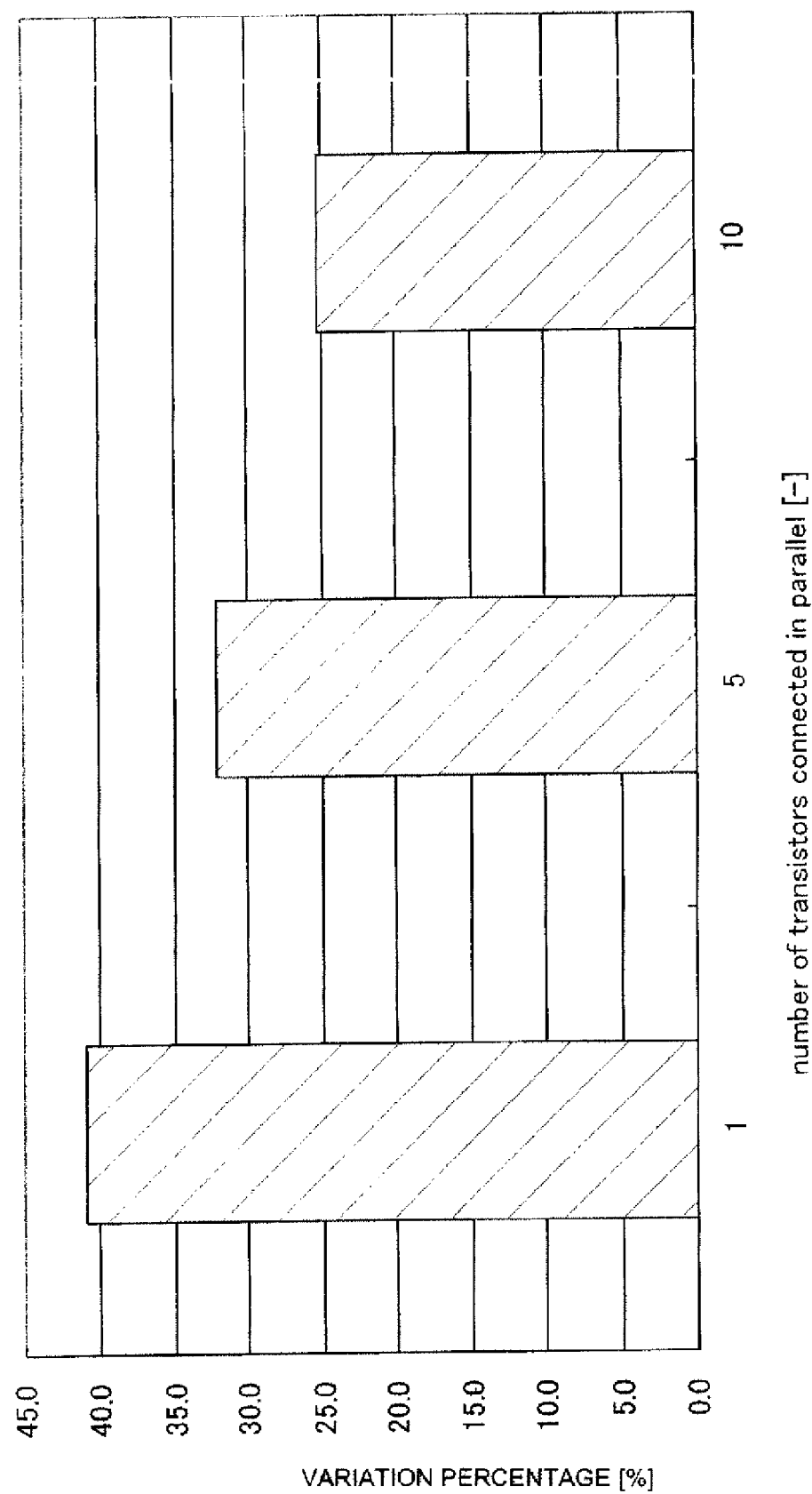
FIG. 10 is a characteristic diagram of Embodiment Mode 3 of the present invention.

As one example, FIG. 10 is a characteristic diagram, showing a case where threshold voltage of the n-channel transistor varies ±0.1 V at most is simulated in each case that the number of the n-channel transistor 105 included in the photoelectric conversion circuit is one, five in parallel connection, and 10 in parallel connection, and how much the output voltage $V_{out}$ changes at most at illuminance 100 lx, is compared based on the deviation from the median of the output voltage $V_{out}$ As shown in FIG. 10, when the n-channel transistor 105 is only one, the output voltage $V_{out}$ varies approximately 40% at most from the median. On the other hand, when five n-channel transistors 105 are connected in parallel, the variation percentage is approximately 32%, and when ten n-channel transistor 105 are connected in parallel, the variation percentage is approximately 25%; thus, the variation can be gradually reduced. Therefore, by providing the plurality of the n-channel transistors 105 connected in parallel the variation of the output voltage $V_{out}$ due to the characteristic variation generated in manufacturing can be suppressed.

Note that this embodiment mode can be implemented by being combined with any technical elements in other embodiment modes of this specification.

Embodiment Mode 4

This embodiment mode will describe a manufacturing method of the photoelectric conversion device described in the above embodiment mode as an example using cross sectional views. Description is made with reference to FIGS. 11A to 12C.

First, a photoelectric conversion element and a field effect transistor are formed over a substrate (a first substrate 310). In this embodiment mode, AN 100, which is one of glass substrates, is used as the substrate 310. A thin film transistor is used as a field effect transistor formed over the substrate so that a photoelectric conversion element and a thin film transistor can be formed on the substrate in the same step; therefore, there is an advantage that the photoelectric conversion device is easy to be produced in large quantities.

Subsequently, a silicon oxide film containing nitrogen (with a film thickness of 100 nm) to be a base insulating film 312 is formed by a plasma CVD method, and a semiconductor film such as an amorphous silicon film containing hydrogen (with a film thickness of 54 nm) is stacked thereover without being exposed to an atmospheric air Alternatively, the base insulating film 312 may be formed by stacking a silicon oxide film, a silicon nitride film, and a silicon oxide film containing nitrogen. For example, a film in which a silicon nitride film containing oxygen with a film thickness of 50 nm and a silicon oxide film containing nitrogen with a film thickness of 100 nm are stacked may be formed as the base insulating film 312. Note that the silicon oxide film containing nitrogen and the silicon nitride film serve as a blocking layer that prevents an impurity such as an alkali metal from diffusing from the glass substrate.

Then, the amorphous silicon film is crystallized by a know technique (a solid-phase growth method, a laser crystallization method, a crystallization method using a catalytic metal, or the like) to form a semiconductor film having a crystalline structure (a crystalline semiconductor film), for example, a polycrystalline silicon film. Here, a polycrystalline silicon film is obtained by a crystallization method using a catalytic element. A nickel acetate solution containing nickel of 10 ppm by weight is added by a spinner Note that a nickel element may be dispersed over the entire surface by a sputtering method instead of a method adding the solution. Then, heat treatment is performed for crystallization to form a semiconductor film (here, polycrystalline silicon) having a crystalline structure. Here, a polycrystalline silicon film is obtained by heat treatment for crystallization (at 550° C. for 4 hours) after the heat treatment (at 500° C. for one hour).

Next, an oxide film over the surface of the polycrystalline silicon film is removed by a dilute hydrofluoric acid or the like. After that, in order to increase a crystallization rate and repair defects left in crystal grains, irradiation with laser light (XeCl: wavelength of 308 nm) is performed in the atmosphere or the oxygen atmosphere.

As the laser light excimer laser light with a wavelength of 400 nm or less; or a second harmonic or a third harmonic of a YAG laser is used. Here, pulsed laser light with a repetition frequency of approximately 10 to 1000 Hz is used, the pulsed laser light is condensed to 100 to 500 mJ/cm$^2$ by an optical system, and irradiation is performed with an overlap rate of 90 to 95%, whereby the surface of the silicon film may be scanned. In this embodiment mode, irradiation with laser light having a repetition frequency of 30 Hz and energy density of 470 mJ/cm$^2$ is performed in the atmosphere.

Note that since laser light irradiation is performed in an atmospheric air or in an oxygen atmosphere, an oxide film is formed on the surface by the laser light irradiation. Note that although an example in which the pulsed laser is used is shown in this embodiment mode, a continuous wave laser may be used instead. In order to obtain crystal with large grain size at the time of crystallization of a semiconductor film, it is preferable to use a solid laser which is capable of continuous oscillation and to apply the second to fourth harmonic of a fundamental wave. Typically, a second harmonic (532 nm) or a third harmonic (355 nm) of an Nd: YVO$_4$ laser (a fundamental wave of 1064 nm) may be applied.

In the case of using a continuous wave laser, laser light which is emitted from a continuous wave YVO$_4$ laser of 10 W output is converted into a harmonic by a non-linear optical element. Alternatively, there is a method by which YVO$_4$ crystal and a non-linear optical element are put in a resonator and a high harmonic is emitted. Then, the laser light having a rectangular shape or an elliptical shape on an irradiated surface is preferably formed by an optical system to be emitted to an object to be processed. At this time, a power density of approximately 0.01 to 100 MW/cm$^2$ (preferably, 0.1 to 10 MW/cm$^2$) is necessary. Then, the semiconductor film may be moved at a rate of approximately 10 to 2000 cm/s relatively to the laser light so as to be irradiated.

Subsequently, in addition to the oxide film which is formed by the above laser light irradiation, a barrier layer formed of an oxide film having a thickness of 1 to 5 nm in total is formed by treatment to the surface with ozone water for 120 seconds. The barrier layer is formed in order to remove the catalytic element which is added for crystallization, for example, nickel (Ni), from the film. Although the barrier layer is formed using ozone water here, the barrier layer may be formed by deposition of an oxide film having a thickness of approximately 1 to 10 nm by a method of oxidizing a surface of the semiconductor film having a crystalline structure by UV-ray irradiation in an oxygen atmosphere; a method of oxidizing a surface of the semiconductor film having a crystalline structure by oxygen plasma treatment; a plasma CVD method; a sputtering method; an evaporation method; or the like. In addition, the oxide film formed by the laser light irradiation may be removed before formation of the barrier layer.

Then, an amorphous silicon film containing an argon element which serves as a gettering site is formed to be 10 to 400 nm thick, here 100 nm thick, over the barrier layer by a sputtering method. Here, the amorphous silicon film containing an argon element is formed under an atmosphere containing argon with the use of a silicon target. In a case where an amorphous silicon film containing an argon element is formed by a plasma CVD method, deposition conditions are as follows: a flow ratio of monosilane to argon ($SiH_4$:Ar) is 1:99, deposition pressure is set to be 6.665 Pa, RF power density is set to be 0.087 W/cm$^2$, and deposition temperature is set to be 350° C.

Thereafter, heat treatment in a furnace heated at 650° C. is performed for 3 minutes to remove a catalytic element (gettering). Accordingly, concentration of the catalytic element in the semiconductor film having a crystalline structure is reduced. A lamp annealing apparatus may be used instead of the furnace.

Subsequently, the amorphous silicon film containing an argon element, which is a gettering site, is selectively removed using the barrier layer as an etching stopper, and thereafter, the barrier layer is removed with a diluted hydrofluoric acid as selected. Note that nickel has a tendency to move to a region having high oxygen concentration at the time of gettering; therefore, it is preferable that the barrier layer formed of an oxide film is removed after gettering.

Note that, in a case where crystallization to the semiconductor film with the use of a catalytic element is not performed, the above steps such as forming the barrier layer, forming the gettering site, heat treatment for gettering, removing the gettering site, and removing the barrier layer are not necessary.

Figure 11A:
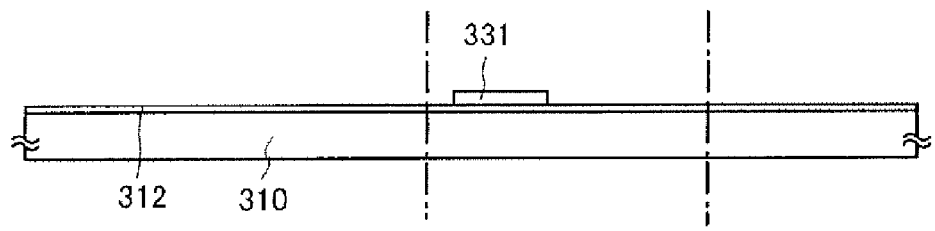
FIGS. 11A to 11D are diagrams showing a manufacturing process of a photoelectric conversion circuit of the present invention.

Subsequently, a thin oxide film is formed on the surface of the obtained semiconductor film having a crystalline structure (for example, a crystalline silicon film) with ozone water, and thereafter, a mask formed of a resist using a first photomask and the semiconductor film is etched into a desired shape to form island-shaped semiconductor film (in this specification, referred to as "an island-shaped semiconductor region 331) that is a semiconductor film separated into an island shape (see FIG. 11A). After the island-shaped semiconductor regions are formed, a mask formed of a resist is removed.

Next, a very small amount of an impurity element (boron or phosphorus) is added in order to control a threshold value of a TFT, if necessary. Here, an ion doping method is used, in which diborane ($B_2H_6$) without mass separation is excited by plasma.

Subsequently, the oxide film is removed with an etchant containing a hydrofluoric acid, and at the same time, the surface of the island-shaped semiconductor region 331 is washed. Thereafter, an insulating film containing silicon as its main component, which becomes a gate insulating film 313, is formed. Here, a silicon oxide film containing nitrogen (composition ratio: Si=32%, O=59%, N=7%, and H=2%) is formed to have a thickness of 115 nm by a plasma CVD method.

Figure 11B:
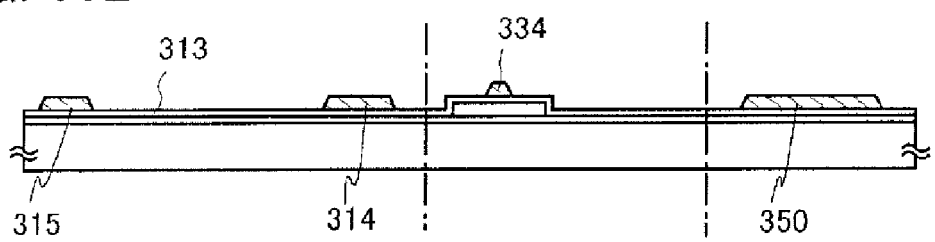

Subsequently, after a metal film is formed over the gate insulating film 313, a second photomask is used to form gate electrodes 334, wirings 314 and 315, and a terminal electrode 350 (see FIG. 11B). As the metal film, for example, a film is used, in which tantalum nitride and tungsten are stacked to be 30 nm and 370 nm respectively.

Additionally, as the gate electrodes 334, the wirings 314 and 315, and the terminal electrode 350, instead of the above film, a single-layer film formed from an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), and copper (Cu), or an alloy material or a compound material containing the above element as its main component; a single-layer film formed from nitride thereof, for example, titanium nitride, tungsten nitride, tantalum nitride or molybdenum nitride may be used.

Figure 11C:
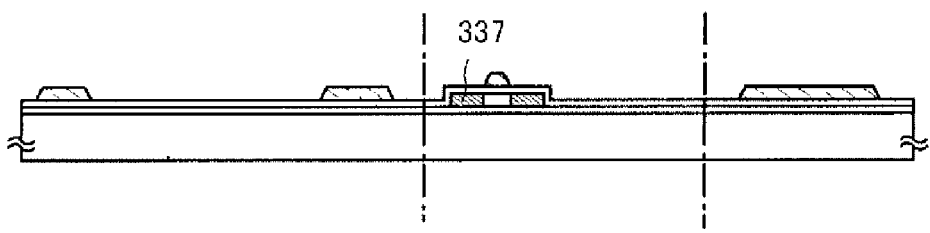

Subsequently, an impurity imparting one conductivity type is introduced to the island-shaped semiconductor region 331 to form a source region and a drain region 337 of a TFT 113 (see FIG. 11C). In this embodiment mode, an n-channel TFT is formed; therefore, an n-type impurity, for example, phosphorus (P) or arsenic (As) is introduced to the island-shaped semiconductor region 331.

Next, a first interlayer insulating film (not shown) including a silicon oxide film is formed to be 50 nm thick by a CVD method, and thereafter, a step is performed, in which the impurity element added to each of the island-shaped semiconductor regions is activated. This activation process is performed by a rapid thermal annealing method (RTA method) using a lamp light source; an irradiation method with a YAG laser or an excimer laser from the back side; heat treatment using a furnace; or a method which is a combination of any of the foregoing methods.

Then, a second interlayer insulating film 316 including a silicon nitride film containing hydrogen and oxygen is formed, for example, to be 10 nm thick.

Figure 11D:
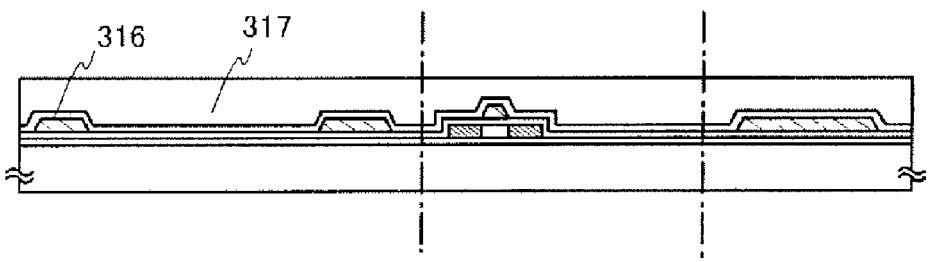

Subsequently, a third interlayer insulating film 317 formed of an insulating material is formed over the second interlayer insulating film 316 (see FIG. 11D). An insulating film obtained by a CVD method can be used for the third interlayer insulating film 317. In this embodiment mode, in order to improve adhesion, a silicon oxide film containing nitrogen is formed to be 900 nm thick as the third interlayer insulating film 317.

Then, heat treatment (heat treatment at 300 to 550° C. for 1 to 12 hours, for example, at 410° C. for 1 hour in a nitrogen atmosphere) is performed to hydrogenate the island-shaped semiconductor films. This step is performed to terminate a dangling bond of the island-shaped semiconductor films by hydrogen contained in the second interlayer insulating film 316. The island-shaped semiconductor films can be hydrogenated regardless of whether or not the gate insulating film 313 is formed.

In addition, as the third interlayer insulating film 317, an insulating film using siloxane and a stacked structure thereof may be used. Siloxane is composed of a skeleton structure of a bond of silicon (Si) and oxygen (O). A compound containing at least hydrogen (such as an alkyl group or an aromatic hydrocarbon) is used as a substituent. Fluorine may be included as a substituent. Alternatively, a compound containing at least hydrogen and fluorine can be used as a substituent.

In a case where an insulating film using siloxane and a stacked structure thereof are used as the third interlayer insulating film 317, after formation of the second interlayer insulating film 316, heat treatment to hydrogenate the island-shaped semiconductor films can be performed, and then, the third interlayer insulating film 317 can be formed.

Subsequently, a mask is formed from a resist using a third photomask, and the first interlayer insulating film, the second interlayer insulating film 316, the third and interlayer insulating film 317, and the gate insulating film 313 are etched to form a contact hole as selected. Then, a mask formed of a resist is removed.

Note that the third interlayer insulating film 317 may be formed if necessary. In a case where the third interlayer insulating film 317 is not formed, the first interlayer insulating film, the second interlayer insulating film 316, and the gate insulating film 313 are etched as selected after formation of the second interlayer insulating film 316 to form a contact hole.

Next, after formation of a metal stacked film by a sputtering method, a mask is formed from a resist using a fourth photomask, and then, the metal film is etched as selected to form a wiring 319, a connection electrode 320, a terminal electrode 351, a source electrode or a drain electrode 341 of the TFT 113. Then, a mask formed of a resist is removed. Note that the metal film of this embodiment mode is a stacked-layer film with three films: a Ti film with a thickness of 100 nm, an Al film containing a very small amount of Si with a thickness of 350 nm, and a Ti film with a thickness of 100 nm.

In addition, in a case where each of the wiring 319, the connection electrode 320, the terminal electrode 351, the source electrode or the drain electrode 341 of the TFT 113 is formed of a single-layer conductive film, a titanium film (Ti film) is preferable in terms of heat resistance, conductivity, and the like. Instead of a titanium film, a single-layer film formed from an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir) and platinum (Pt), or an alloy material or a compound material containing the above element as its main component; a single-layer film formed from nitride thereof, for example, titanium nitride, tungsten nitride, tantalum nitride, or molybdenum nitride may be used. The number of times of deposition can be reduced in the manufacturing process, by formation of each of the wiring 319, the connection electrode 320, the terminal electrode 351, and the source electrode or the drain electrode 341 of the TFT 113 as a single-layer film.

The top gate TFT 113 using a polycrystalline silicon film can be manufactured through the process described above.

Figure 12A:
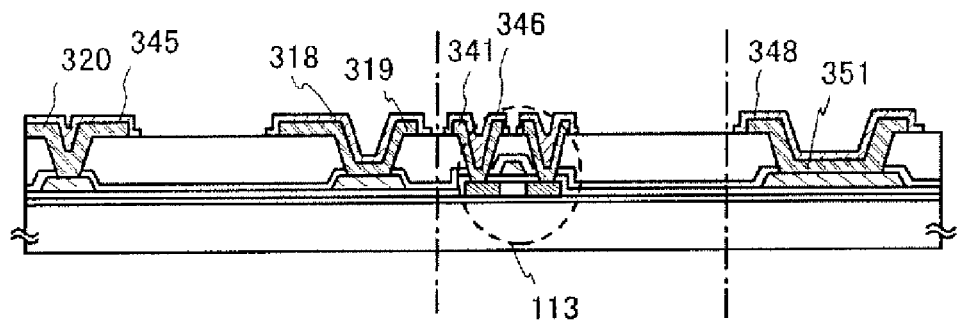
FIGS. 12A to 12C are diagrams showing a manufacturing process of a photoelectric conversion circuit of the present invention.

Subsequently, after formation of a conductive metal film (such as titanium (Ti) or molybdenum (Mo)) which is not likely to be an alloy by reacting with a photoelectric conversion layer (typically, amorphous silicon) which is formed later, a mask is formed from a resist using a fifth photomask, and then, the conductive metal film is etched as selected to form protective electrodes 318, 345, 346, and 348 which cover the wiring 319 (see FIG. 12A). Here, a Ti film having a thickness of 200 nM obtained by a sputtering method is used. Note that the connection electrode 320, the terminal electrode 351, and the source electrode or the drain electrode 341 of the TFT 113 are also covered with a conductive metal film. Thus, the conductive metal film also covers a side face where the second Al film is exposed in these electrodes; therefore, the conductive metal film can also prevent diffusion of an aluminum atom to the photoelectric conversion layer.

Note that in a case where each of the wiring 319, the connection electrode 320, the terminal electrode 351, and the source electrode or the drain electrode 341 of the TFT 113 are formed as a single-layer conductive film, the protective electrode 318, 345, 346, and 348 are not necessarily formed.

Subsequently, a photoelectric conversion layer 111 including a p-type semiconductor layer 111p, an i-type semiconductor layer 111i, and an n-type semiconductor layer 111n is formed over the third interlayer insulating film 317.

The p-type semiconductor layer 111p may be formed by deposition of a semi-amorphous silicon film containing an impurity element belonging to Group 13 of the periodic table such as boron (B) by a plasma CVD method.

In addition, the wiring 319 and the protective electrode 318 are in contact with the bottom layer of the photoelectric conversion layer 111, in this embodiment mode, the p-type semiconductor layer 111p.

After the p-type semiconductor layer 111p is formed, the i-type semiconductor layer 111i and the n-type semiconductor layer 111n are sequentially formed. Accordingly, the photoelectric conversion layer 111 including the p-type semiconductor layer 111p, the i-type semiconductor layer 111i and the n-type semiconductor layer 111n is formed.

As the i-type semiconductor layer 111i, for example, a semi-amorphous silicon film may be formed by a plasma CVD method. Note that as the n-type semiconductor layer 111n, a semi-amorphous silicon film containing an impurity element belonging to Group 15 of the periodic table, for example, phosphorus (P) may be formed, or after formation of a semi-amorphous silicon film, an impurity element belonging to Group 15 of the periodic table may be introduced.

Alternatively, as the p-type semiconductor layer 111p, the i-type semiconductor layer 111i and the n-type semiconductor layer 111n, an amorphous semiconductor film may be used as well as a semi-amorphous semiconductor film.

Figure 12B:
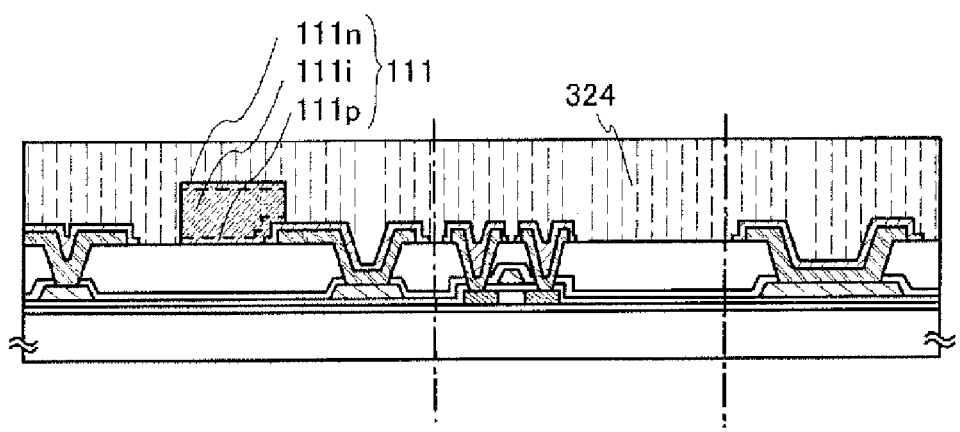

Next, a sealing layer 324 is formed from an insulating material (for example, an inorganic insulating film containing silicon) to have a thickness of 1 to 30 μm over the entire surface to obtain a state shown in FIG. 12B. Here, as an insulating material film, a silicon oxide film containing nitrogen with a thickness of 1 μm is formed by a CVD method. By using insulating film formed by CVD method, improvement in adhesion can be achieved.

Subsequently, after the sealing layer 324 is etched to provide an opening, terminal electrodes 121 and 122 are formed by a sputtering method. Each of the terminal electrode 121 and 122 is a stacked-layer film of a titanium film (Ti film) (100 nm), a nickel film (Ni film) (300 nm), and a gold film (Au film) (50 nm). The thus obtained terminal electrodes 121 and 122 have a fixing intensity of higher than 5 N, which is sufficient fixing intensity as a terminal electrode.

Figure 12C:
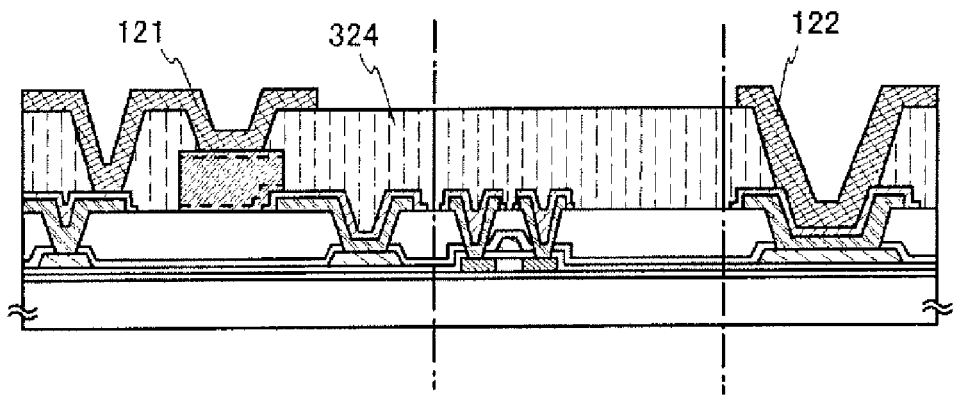

Through the process described above, the terminal electrodes 121 and 122 which can be connected by a solder are formed, and a structure shown in FIG. 12C can be obtained.

Note that a substrate over which a plurality of the photoelectric conversion circuits are formed can be cut into separate sections to obtain a plurality of photoelectric conversion circuit. For example, a large number of photoelectric conversion circuits (for example, 2 mm×1.5 mm) can be manufactured from one large-sized substrate (for example, 600 cm×720 cm) so that the photoelectric conversion circuit obtained by the above process can be produced in large quantities.

Note that this embodiment mode can be implemented by being combined with any technical elements in other embodiment modes of this specification.

Embodiment Mode 5

This embodiment mode will describe a manufacturing method of the photoelectric conversion device mentioned in the above embodiment mode, which is different from embodiment mode 4, using cross sectional views. In this embodiment mode, a structure of field effect transistor formed from a bottom gate TFT is described with reference to FIGS. 13A to 14C.

Figure 13A:
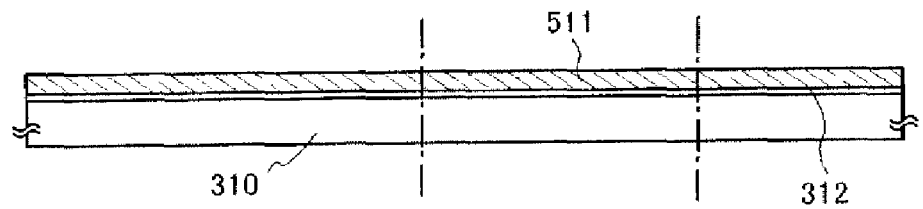
FIGS. 13A to 13E are diagrams showing a manufacturing process of a photoelectric conversion circuit of the present invention.

First, a base insulating film 312 and a metal film 511 are formed over the substrate 310 (see FIG. 13A). As the metal film 511, in this embodiment mode, a stacked-layer film of tantalum nitride having a thickness of 30 mm and tungsten having a thickness of 370 nm is used, for example.

In addition, as the metal film 511, instead of the above film, a single-layer film formed of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag) and copper (Cu), or an alloy material or a compound material containing the above element as its main component; or a single-layer film formed from nitride thereof such as titanium nitride, tungsten nitride, tantalum nitride, or molybdenum nitride may be used.

Note that the metal film 511 may be formed directly on the substrate 310 without formation of the base insulating film 312 over the substrate 310.

Figure 13B:
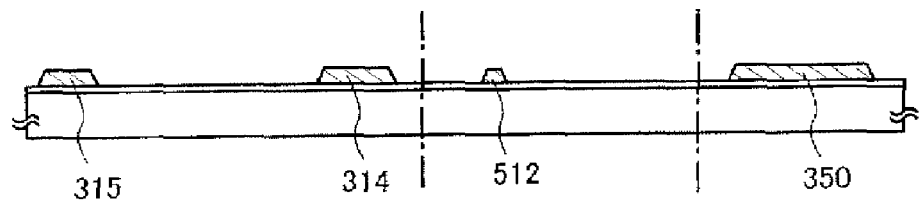
Figure 13C:
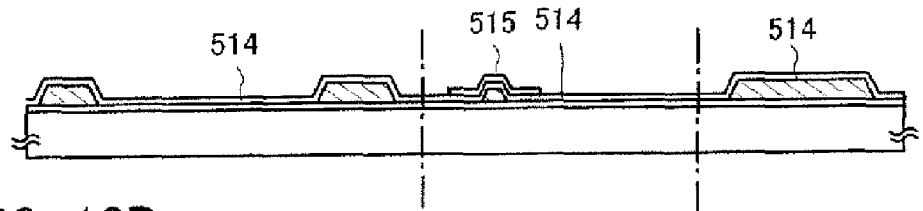

Next, the metal film 511 is used to form a gate electrode 512, wirings 314 and 315 and a terminal electrode 350 (see FIG. 13B).

Subsequently, a gate insulating film 514 which covers the gate electrode 512, the wirings 314 and 315 and the terminal electrode 350 is formed. In this embodiment mode, the gate insulating film 514 is formed using an insulating film containing silicon as its main component, for example, a silicon oxide film containing nitrogen (composition ratio Si=32%, O=59%, N=7%, H=2%) having a thickness of 115 nm by a plasma CVD method.

Next, an island-shaped semiconductor region 515 is formed over the gate insulating film 514. The island-shaped semiconductor region 515 may be formed by the similar material and manufacturing process to those of the island-shaped semiconductor region 331 described in Embodiment Mode 4 (see FIG. 13C).

Figure 13D:
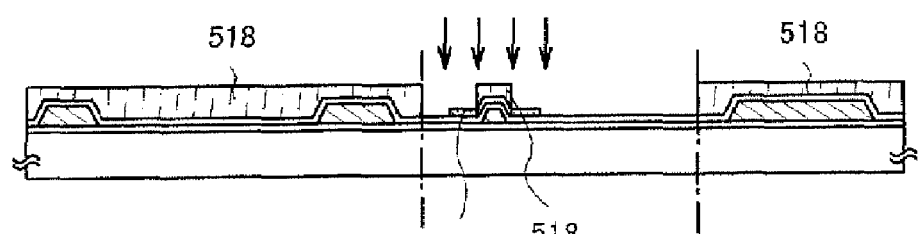

After the island-shaped semiconductor region 515 is formed, a mask 518 is formed to cover portions except for regions which become a source region or a drain region 521 of a TFT 503, and later, an impurity imparting one conductivity type is introduced (see FIG. 13D). As the one conductivity-type impurity, in a case of forming an n-channel TFT, phosphorus (P) or arsenic (As) may be used as an n-type impurity, whereas in a case of forming a p-channel TFT, boron (B) may be used as a p-type impurity. In this embodiment mode, phosphorus (P) which is an n-type impurity is introduced to the island-shaped semiconductor region 515 so that a channel formation region is formed between the source region or the drain region 521 and a source region or a drain region 521 of the TFT 503.

Figure 13E:
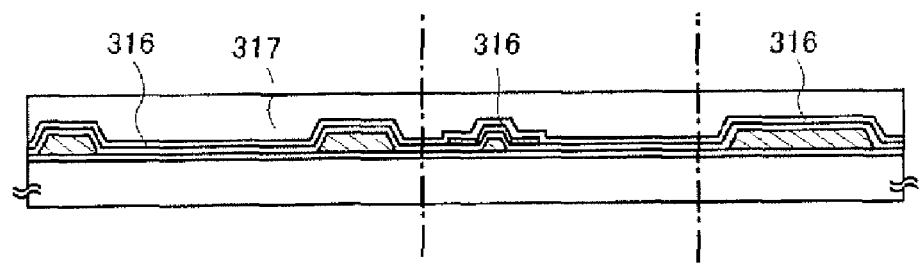

Next, the mask 518 is removed, and a first interlayer insulating film which is not shown, a second interlayer insulating film 316, and a third interlayer insulating film 317 are formed (see FIG. 13E). A material and a manufacturing process of the first interlayer insulating film, the second interlayer insulating film 316, and the third interlayer insulating film 317 may be based on the description in Embodiment Mode 4.

Contact holes are formed in the first interlayer insulating film, the second interlayer insulating film 316 and the third interlayer insulating film 317, a metal film is formed, and further, the metal film is etched as selected to form the wiring 319, the connection electrode 320, the terminal electrode 351, a source electrode or a drain electrode 531 of the TFT 503. Then, a mask formed of a resist is removed. Note that the metal film of this embodiment mode is a stacked-layer film including three layers: a Ti film having a thickness of 100 nm, an Al film containing a very small amount of Si having a thickness of 350 nm, and a Ti film having a thickness of 100 nm.

In addition, as for the wiring 319 and a protective electrode thereof 318; the connection electrode 320 and a protective electrode thereof 533; the terminal electrode 351 and a protective electrode thereof 538; the source electrode and the drain electrode 531 of the TFT 503 and a protective electrode thereof 536, each wiring and electrode may be formed using a single-layer conductive film.

Figure 14A:
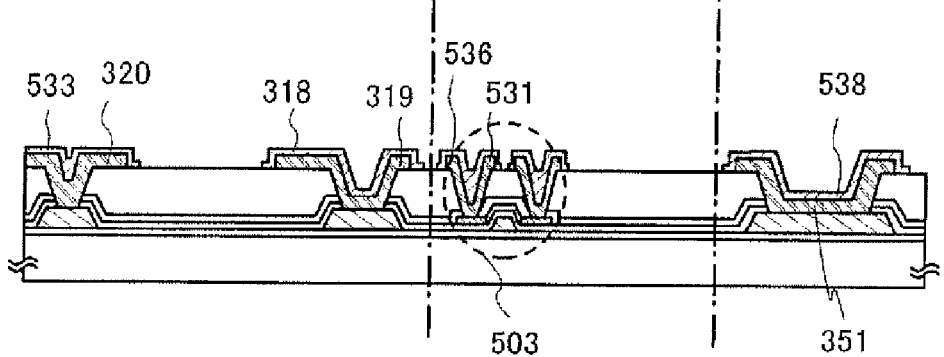
FIGS. 14A to 14C are diagrams showing a manufacturing process of a photoelectric conversion circuit of the present invention.

Through the above process, bottom gate TFT 503 can be manufactured (see FIG. 14A).

Figure 14B:
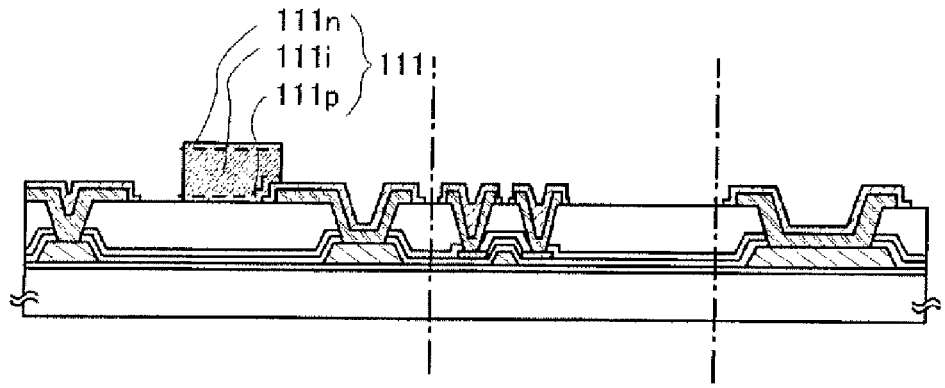

Subsequently, the photoelectric conversion layer 111 including the p-type semiconductor layer 111p, the i-type semiconductor layer 111i and the n-type semiconductor layer 111n is formed over the third interlayer insulating film 317 (see FIG. 14B). A material, a manufacturing process and the like of the photoelectric conversion layer 111 may be based on the description in Embodiment Mode 4.

Figure 14C:
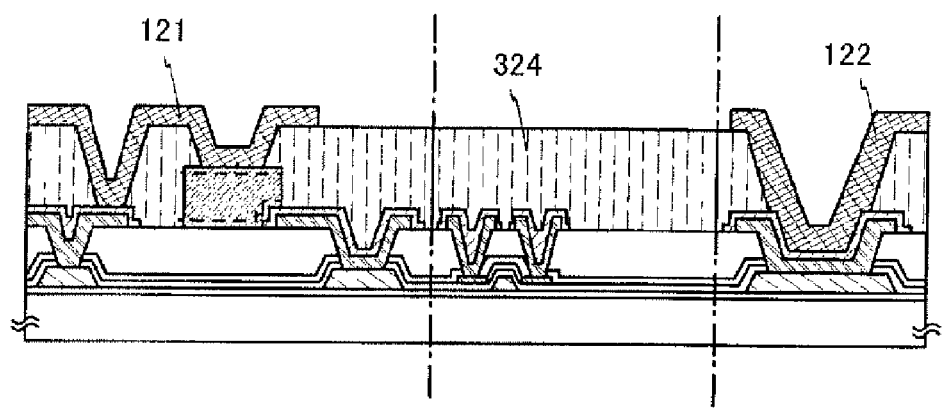

Next, the sealing layer 324 and the terminal electrodes 121 and 122 are formed (FIG. 14C). The terminal electrode 121 is connected to the n-type semiconductor layer 111n, and the terminal electrode 122 is formed in the same process as the terminal electrode 121.

Moreover, a substrate 360 having the electrodes 361 and 362 is mounted using the solders 364 and 363. Note that the electrode 361 on the substrate 360 is mounted on the terminal electrode 121 by the solder 364. In addition, the electrode 362 on the substrate 360 is mounted on the terminal electrode 122 by the solder 363 (see FIG. 15).

Figure 15:
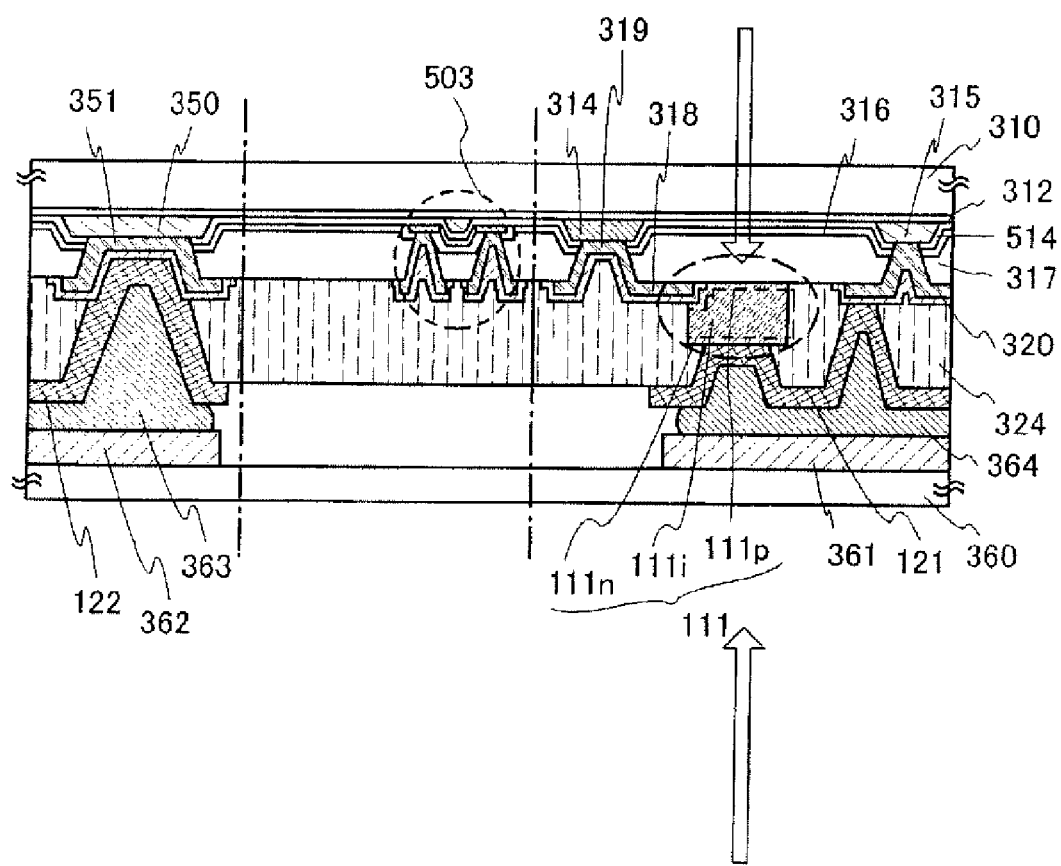
FIG. 15 is a cross-sectional view of a photoelectric conversion circuit of the present invention.

In a photoelectric conversion circuit shown in FIG. 15, the light which enters the photoelectric conversion layer 111 can enter both the substrate 310 side and the substrate 360 side by using the light-transmitting substrates 310 and 360.

Note that this embodiment mode can be implemented by being combined with any technical elements in other embodiment modes of this specification.

Embodiment Mode 6

This embodiment mode will describe an example in which a photoelectric conversion device of the present invention is provided in a housing to control the direction of light which enters, with reference to FIGS. 16A to 17B.

Figure 16A:
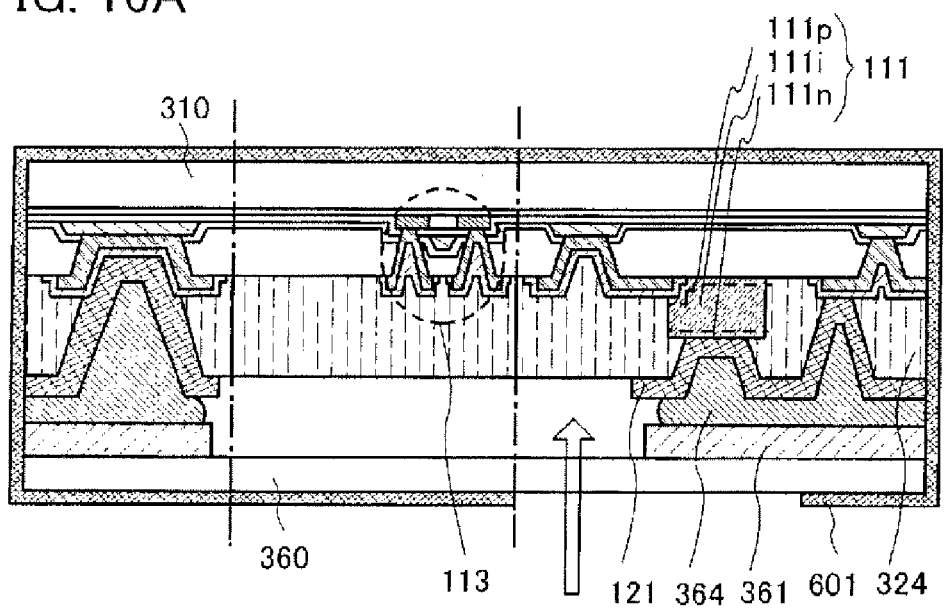
FIGS. 16A and 16B are cross-sectional views of photoelectric conversion circuits of the present invention.

FIG. 16A shows that after the terminal electrode 121 in a photoelectric conversion device shown in FIG. 12C is mounted on the electrode 361 over the substrate 360 by the solder 364, a housing 601 is formed so that light enters the photoelectric conversion layer 111 not from a substrate 310 side but from a substrate 360 side. The housing 601 is provided with an opening in a region where the photoelectric conversion layer 111 is formed on the substrate 360.

Although the terminal electrode 121, the electrode 361, and the solder 364 exist in FIG. 16A, the light which enters from the substrate 360 side enters the photoelectric conversion layer 111 obliquely through the sealing layer 324, so that the photocurrent is generated and light can be detected.

Any material may be used for the housing 601, and housings 602 to 604, which will be mentioned below, as long as the material has a function of blocking light. For example, a metal material, a resin material including black pigment, or the like may be used for the material of the housing.

Figure 16B:
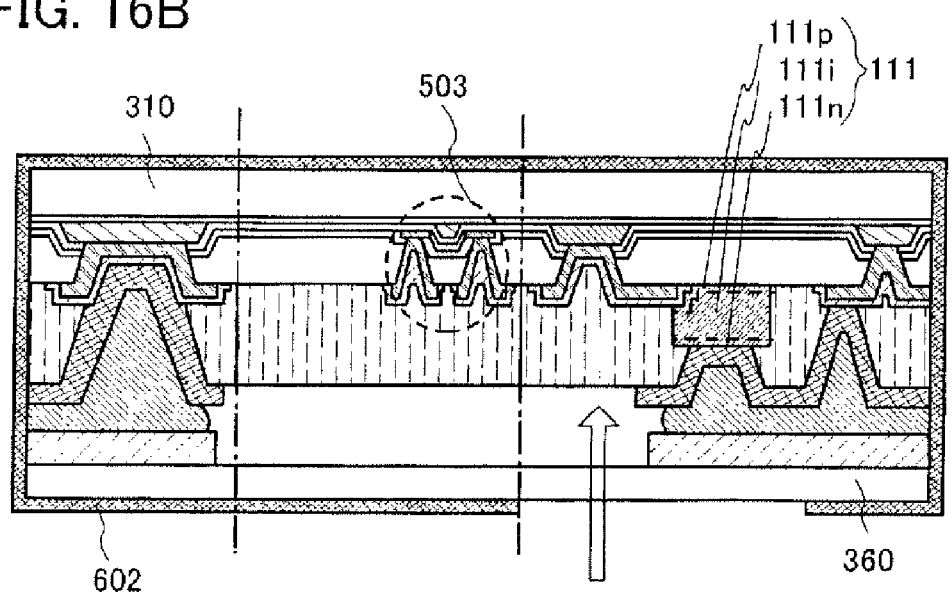

In FIG. 16B the photoelectric conversion circuit shown in FIG. 15 is provided with a housing 602 so that light enters a photoelectric conversion layer 111 not from a substrate 310 side but from a substrate 360 side. The housing 602 is provided with an opening in a region where the substrate 360 side of the photoelectric conversion layer 111 is formed.

In FIG. 16B as well as FIG. 16A, the light which enters from the substrate 360 side enters the photoelectric conversion layer 111 obliquely through the sealing layer 324, so that the photocurrent is generated and light can be detected.

Figure 17A:
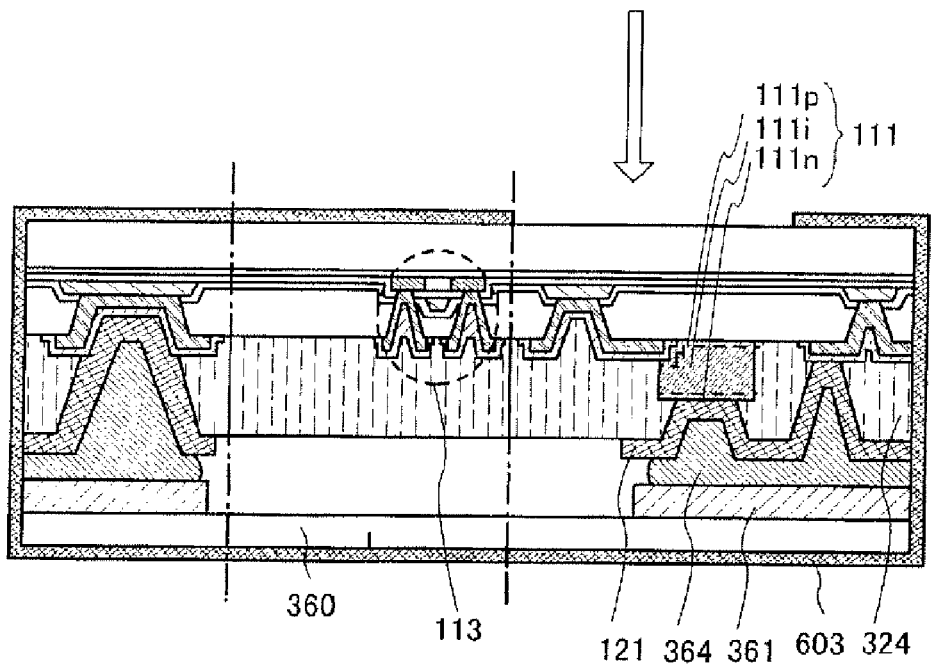
FIGS. 17A and 17B are cross-sectional views of photoelectric conversion circuits of the present invention.

FIG. 17A shows that after the terminal electrode 121 in a photoelectric conversion device shown in FIG. 12C is mounted on the electrode 361 over the substrate 360 by the solder 364, a housing 603 is formed so that light enters a photoelectric conversion layer 111 not from a substrate 360 side but from a substrate 310 side. The housing 603 is provided with an opening in a region where the substrate 310 side of the photoelectric conversion layer 111 is formed.

In FIG. 17A, the light which enters from the substrate 310 side enters the photoelectric conversion layer 111, so that the photocurrent is generated and light can be detected.

Figure 17B:
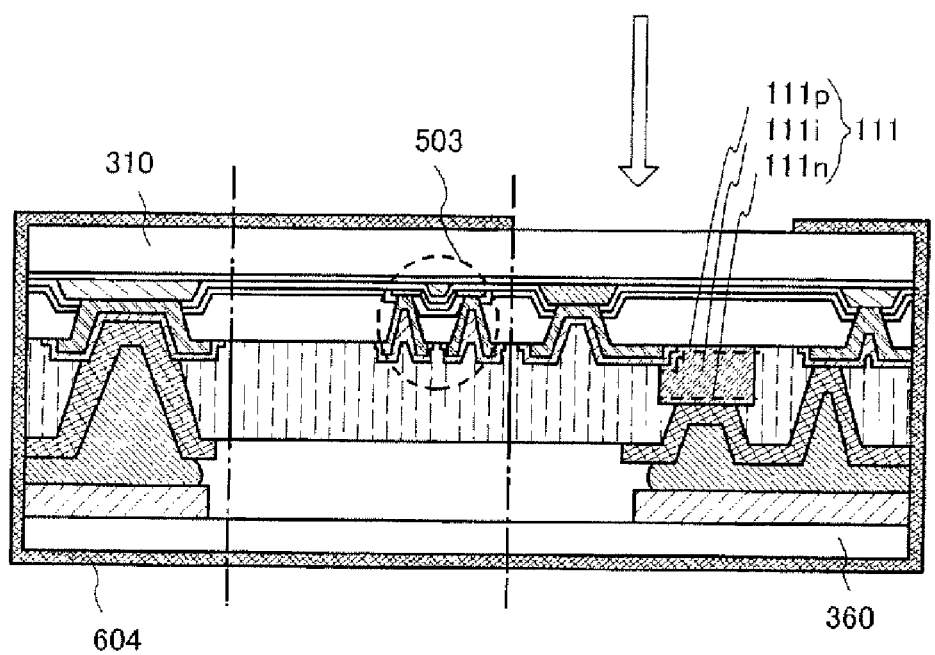

In the FIG. 17B the photoelectric conversion circuit shown in FIG. 15 is provided with a housing 604 so that light enters a photoelectric conversion layer 111 not from a substrate 360 side but from a substrate 310 side. The housing 604 is provided with an opening in a region where the substrate 310 side of the photoelectric conversion layer 111 is formed.

In FIG. 17B, the light which enters from the substrate 310 side enters the photoelectric conversion layer 111, so that the photocurrent is generated and light can be detected.

Note that this embodiment mode can be implemented by being combined with any technical elements in other embodiment modes of this specification.

Embodiment Mode 7

In this embodiment mode, an example in which a photoelectric conversion device obtained by the present invention is incorporated in various electronic devices is described. As electronic devices to which the present invention is applied, a computer, a display, a mobile phone, a TV set and the like are given. Specific examples of those electronic devices are shown in FIGS. 18 to 22B.

Figure 18:
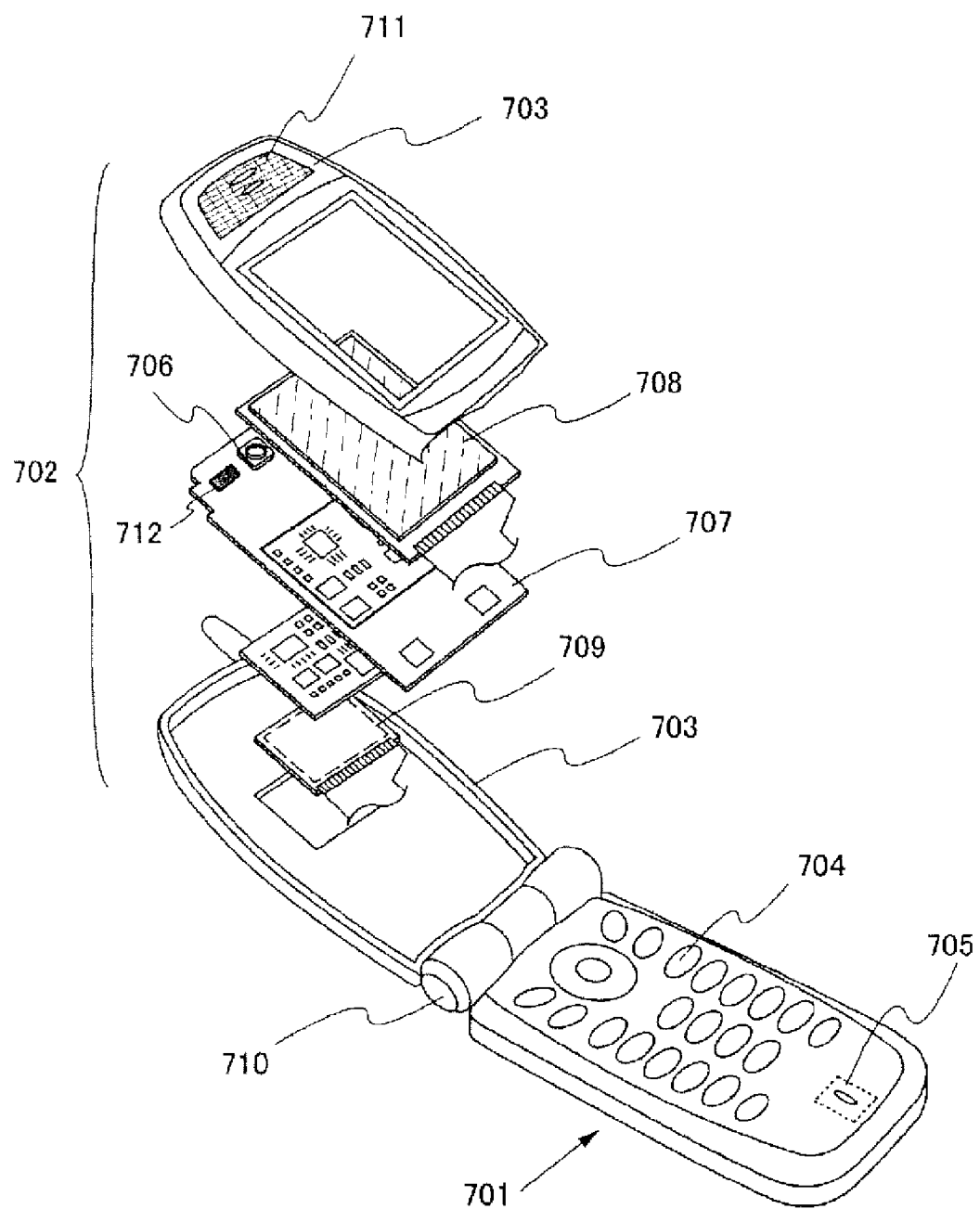
FIG. 18 is a diagram showing a device on which a photoelectric conversion device of the present invention is mounted.

FIG. 18 shows a mobile phone and includes a main body (A) 701, a main body (B) 702, a housing 703, operation keys 704, an audio output portion 705, an audio input portion 706, a circuit substrate 707, a display panel (A) 708, a display panel (B) 709, a hinge 710, a light-transmitting material portion 711 and a photoelectric conversion device 712. The present invention can be applied to the photoelectric conversion device 712.

The photoelectric conversion device 712 detects the light which transmits through the light-transmitting material portion 711, and the luminance of the display panel (A) 708 and the display panel (B) 709 is controlled based on the illuminance of external light that is detected, or illumination of the operation keys 704 is controlled based on the illuminance obtained by the photoelectric conversion device 712. Accordingly, current consumption of the mobile phone can be reduced.

Figure 19A:
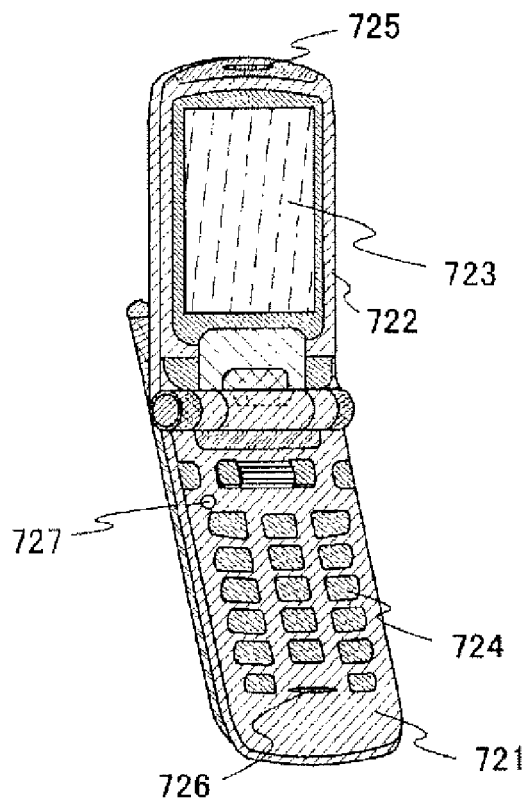
FIGS. 19A and 19B are diagrams showing device on which a photoelectric conversion devices of the present invention is mounted.
Figure 19B:
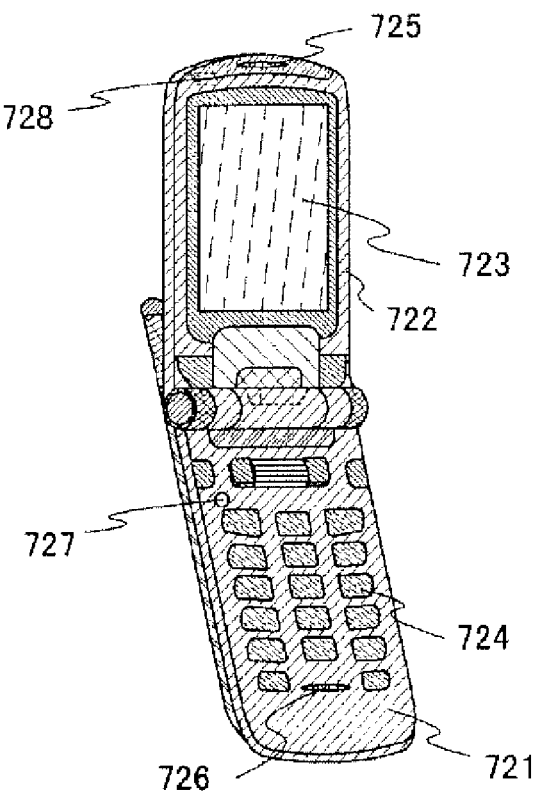

FIGS. 19A and 19B show another example of a mobile phone. In FIGS. 19A and 19B, reference numeral 721 denotes a main body, 722 denotes a housing, 723 denotes a display panel, 724 denotes operation keys, 725 denotes an audio output portion, 726 denotes an audio input portion, 727 denotes a photoelectric conversion device, and 728 denotes a photoelectric conversion device.

In the mobile phone shown in FIG. 19A, the luminance of the display panel 723 and the operation keys 724 can be controlled by detecting the light from the exterior with the photoelectric conversion device 727 which is provided in the main body 721.

In the mobile phone shown in FIG. 19B, the photoelectric conversion device 728 is provided inside the main body 721 in addition to the structure of FIG. 19A. By the photoelectric conversion device 728, the luminance of the backlight which is provided in the display panel 723 also can be detected.

Figure 20A:
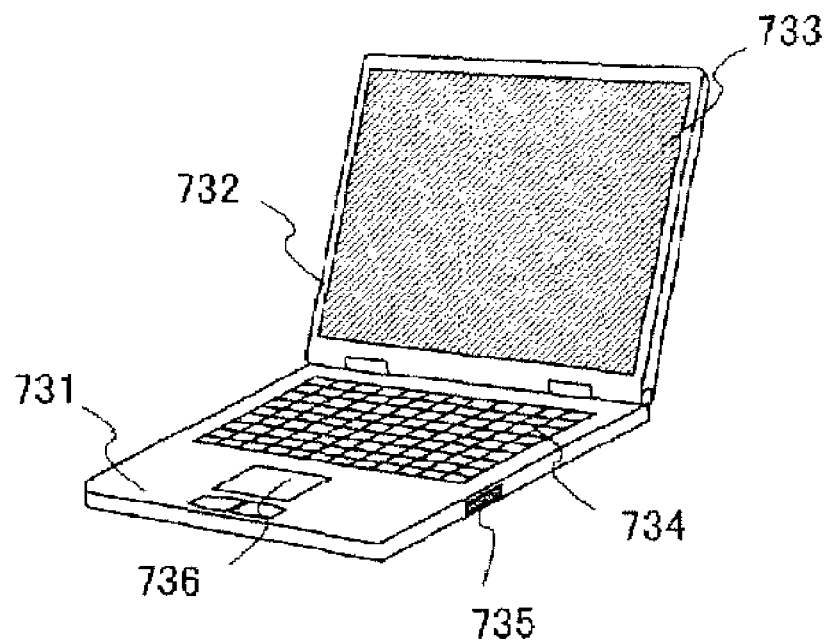
FIGS. 20A and 20B are diagrams showing device on which a photoelectric conversion devices of the present invention is mounted.

FIG. 20A shows a computer including a main body 731, a housing 732, a display portion 733, a keyboard 734, an external connection port 735, a pointing device 736, and the like.

Figure 20B:
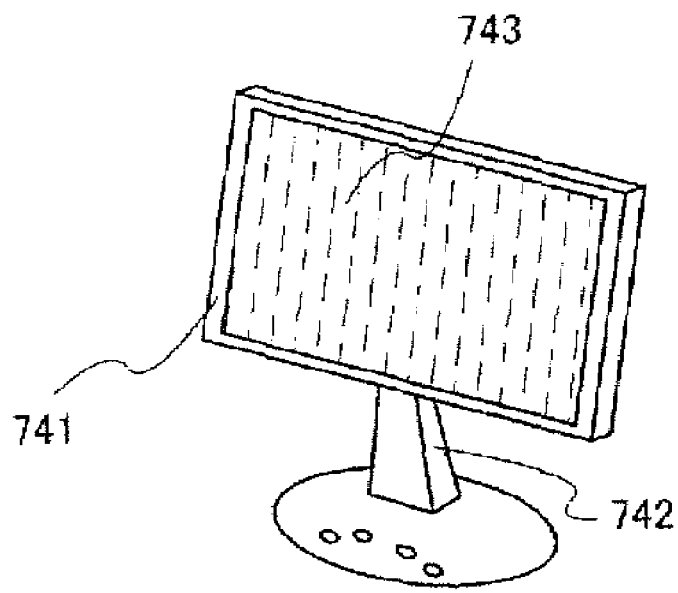

FIG. 20B shows a display device, and corresponds to a television receiver or the like. The display device includes a housing 741, a supporting base 742, a display portion 743, and the like.

Figure 21:
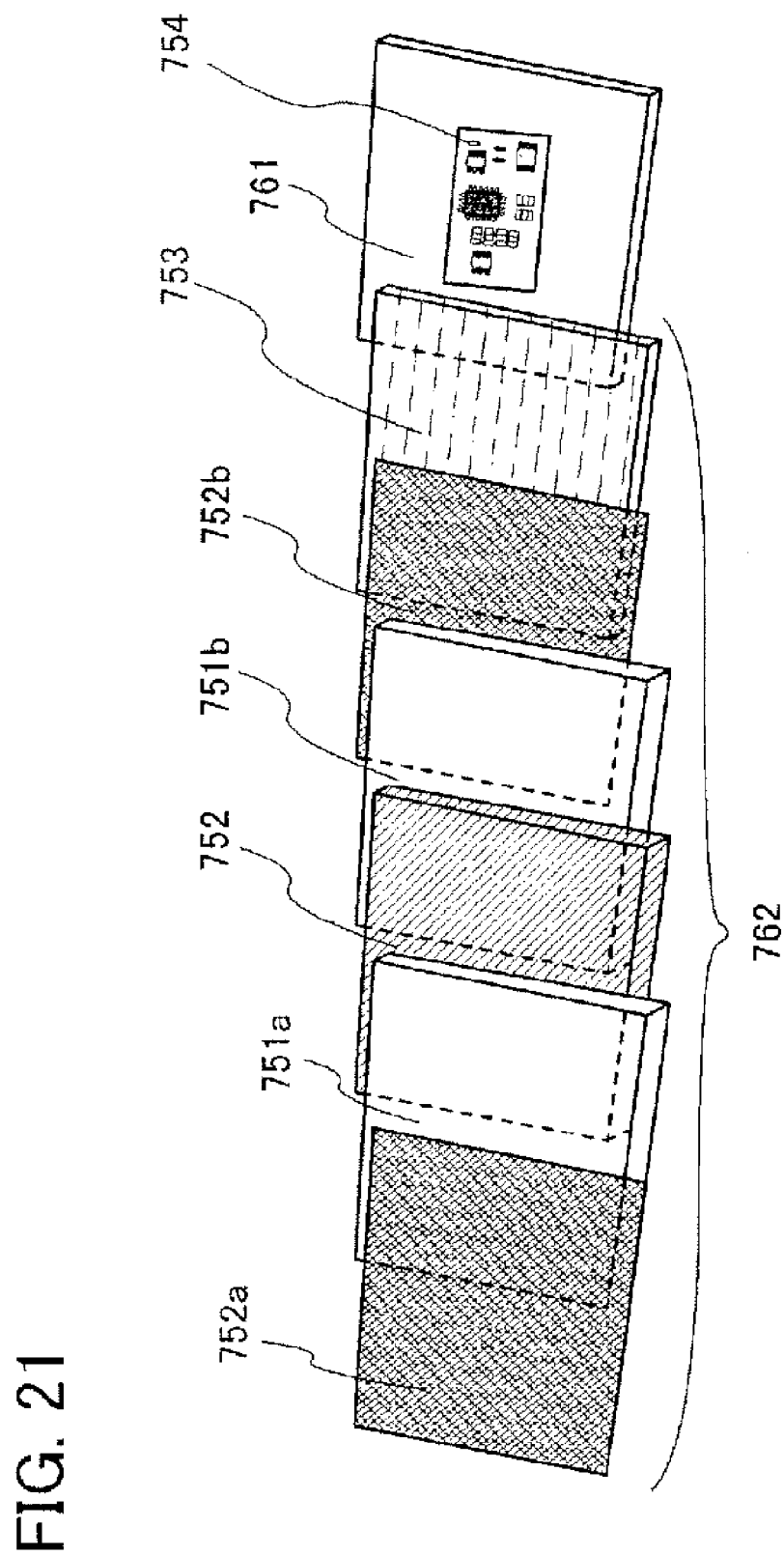
FIG. 21 is a diagram showing a device on which a photoelectric conversion device of the present invention is mounted.

FIG. 21 shows a detailed structure in the case of using a liquid crystal panel as a display portion 733 provided in a computer shown in FIG. 20A, and as the display portion 743 of the display device shown in FIG. 20B.

A liquid crystal panel 762 shown in FIG. 21 is incorporated in a housing 761 and includes substrates 751a and 751b, a liquid crystal layer 752 interposed between the substrates 751a and 751b, polarizing filters 752a and 752b, a backlight 753, and the like. A housing 761 is provided with a photoelectric conversion device 754.

The photoelectric conversion device 754 which is manufactured using the present invention detects the amount of light from the backlight 753, and the information is fed back to adjust the luminance of the liquid crystal panel 762.

Figure 22A:
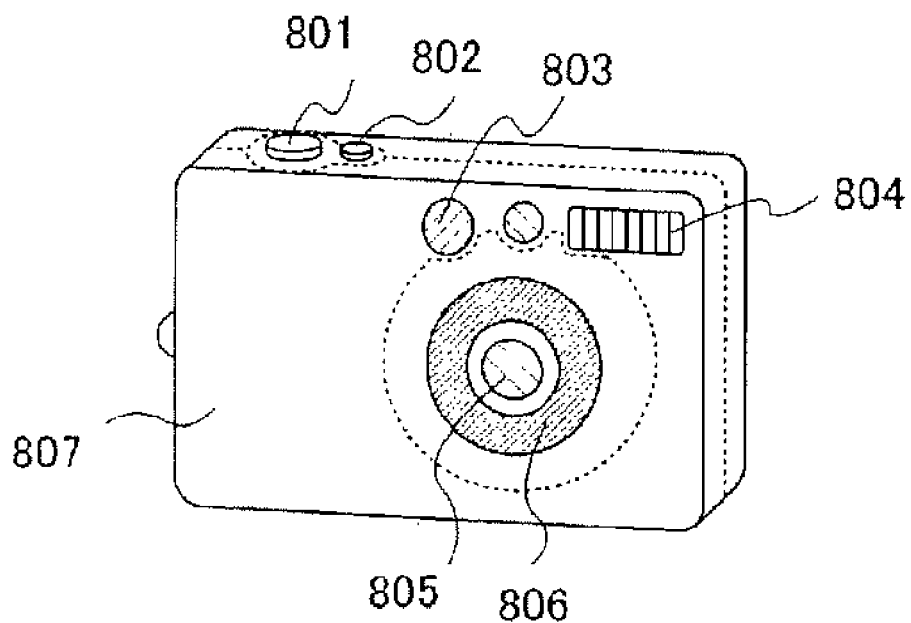
FIGS. 22A and 22B are diagrams showing a device on which a photoelectric conversion device of the present invention is mounted.
Figure 22B:
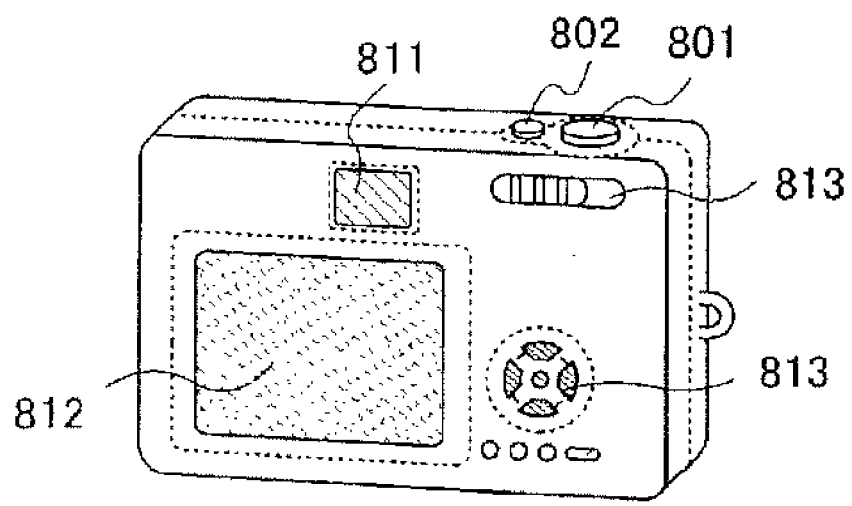

FIGS. 22A and 22B are views each showing an example in which the photoelectric conversion device of the present invention is incorporated in a camera such as a digital camera. FIG. 22A is a front perspective view seen from the front side of the digital camera, and FIG. 22B is a back perspective view seen from the back side of the digital camera. In FIG. 22A, the digital camera is provided with a release button 801, a main switch 802, a viewfinder 803, a flush portion 804, a lens 805, a lens barrel 806, and a housing 807.

In addition, in FIG. 22B, a viewfinder eyepiece 811, a monitor 812, and operation buttons 813 are provided.

When the release button 801 is pressed down halfway, a focusing adjusting mechanism and an exposure adjusting mechanism are operated, and when the release button is pressed down fully, a shutter is opened.

The main switch 802 switches ON or OFF of a power source of a digital camera by being pressed or rotated.

The viewfinder 803 is placed at the upper portion of the lens 805 of a front side of the digital camera, and is a device for recognizing an area which is taken or a focus position from the viewfinder eyepiece 811 shown in FIG. 22B.

The flush portion 804 is placed at the upper portion of the front side of the digital camera, and when object luminance is low, supporting light is emitted at the same time as the release button is pressed down so that the shutter is opened.

The lens 805 is placed at the front face of the digital camera. The lens is formed of a focusing lens, a zoom lens, or the like, and forms a photographing optical system with a shutter and aperture that are not shown. Note that an image pickup device such as CCD (Charge Coupled Device) is provided at the rear of the lens.

The lens barrel 806 moves a lens position to adjust the focus of the focusing lens, the zoom lens, and the like. When shooting, the lens barrel is slid out to move the lens 805 forward. In addition, when carrying the camera, the lens 805 is moved backward so as to make the camera compact. Note that a structure is employed in this embodiment mode, in which the lens barrel is slid out so that the object can be shot by being zoomed; however, the present invention is not limited thereto. Instead, a digital camera may employ a structure in which zoom shooting can be conducted without sliding out the lens barrel by a photographing optical system inside the housing 807.

The viewfinder eyepiece 811 is provided at the upper portion of the rear side of the digital camera, for looking through when checking an area which is taken or a focus point.

The operation buttons 813 are buttons for various functions that are provided at the rear side of the digital camera and include a set up button, a menu button, a display button, a functional button, a selection button and the like.

When the photoelectric conversion device of the present invention is incorporated in the camera shown in FIGS. 22A and 22B, the photoelectric conversion device can detect the light intensity and whether light exists or not; accordingly, an exposure adjustment or the like of the camera can be performed. By the photoelectric conversion device of the present invention, the number of field effect transistor included in the photoelectric conversion circuit can be reduced, and the packaging area can be reduced, whereby the device can be miniaturized. Miniaturization of a part like an optical sensor provided with a photoelectric conversion circuit is effective particularly when the part is used for portable electronic devices.

In addition, the photoelectric conversion device of the present invention can also be applied to other electronic devices such as a projection TV and a navigation system, for example. In other words, the photoelectric conversion device of the present invention can be applied to anything that is necessary to detect light.

Note that this embodiment mode can be implemented by being combined with any technical elements in other embodiment modes of this specification.

This application is based on Japanese Patent Application serial No. 2007-078571 filed with Japan Patent Office on Mar. 26, 2007, the entire contents of which are hereby incorporated by reference.

EXPLANATION OF REFERENCE 101 photoelectric conversion circuit
102 voltage detection circuit
103 DC power supply
104 photoelectric conversion element
105 n-channel transistor
106 output terminal
111 photoelectric conversion layer
113 TFT
121 terminal electrode
122 terminal electrode
201 p-channel transistor
310 substrate
312 base insulating film
313 gate insulating film
314 wiring
316 interlayer insulating film
317 interlayer insulating film
318 protective electrode
319 wiring
320 connection electrode
324 sealing layer
331 island-shaped semiconductor region
334 gate electrode
337 drain region
341 drain electrode
345 protective electrode
346 protective electrode
350 terminal electrode
351 terminal electrode
360 substrate
361 electrode
362 electrode
363 solder
364 solder
401 load resistor
501 current amplifier
503 TFT
511 metal film
512 gate electrode
514 gate insulating film
515 island-shaped semiconductor region
518 mask
521 drain region
531 drain electrode
533 protective electrode
536 protective electrode
538 protective electrode
601 housing
602 housing
603 housing
604 housing
701 main body (A)
702 main body (B)
703 horsing
704 operation keys
705 audio output portion
706 audio input portion
707 circuit substrate
708 display panel (A)
709 display panel (B)
710 hinge
711 light-transmitting material portion
712 photoelectric conversion device
721 main body
722 housing
723 display panel
724 operation keys
725 audio output portion
726 audio input portion
727 photoelectric conversion device
728 photoelectric conversion device
731 main body
732 housing
733 display portion
734 keyboard
735 external connection part
736 pointing device
741 housing
742 supporting base
743 display portion
752 liquid crystal layer
753 backlight
754 photoelectric conversion device
761 housing
762 liquid crystal pastel
801 release button
802 main switch
803 viewfinder
804 flush portion
805 lens
806 lens barrel
807 housing
811 viewfinder eyepiece
812 monitor
813 operation buttons

The invention claimed is:

1. A photoelectric conversion device comprising:
a photoelectric conversion element;
a first field effect transistor wherein a gate terminal and a drain terminal of the first field effect transistor are electrically connected to the photoelectric conversion element;

a second field effect transistor electrically connected to the first field effect transistor in parallel;

a DC power supply wherein a first terminal of the DC power supply is electrically connected to the photoelectric conversion element and a second terminal of the DC power supply is electrically connected to a source terminal of the first field effect transistor; and a voltage detection circuit configured to detect a voltage generated at the gate terminal of the first field effect transistor, the voltage detection circuit being electrically connected to the gate terminal and the drain terminal of the first field effect transistor.

2. The photoelectric conversion device according to claim 1, wherein the photoelectric conversion element comprises a p-type semiconductor layer, an i-type semiconductor layer, and an n-type semiconductor layer.

3. The photoelectric conversion device according to claim 1, wherein the first field effect transistor is a thin film transistor.

4. The photoelectric conversion device according to claim 1, wherein the photoelectric conversion element and the first field effect transistor are provided over a light-transmitting substrate.

5. The photoelectric conversion device according to claim 1, wherein the photoelectric conversion device comprises a plurality of the second field effect transistors wherein the plurality of the second field effect transistors are connected in parallel.

6. The photoelectric conversion device according to claim 1, wherein the first field effect transistor is formed by using an SOI substrate.

7. The photoelectric conversion device according to claim 1, wherein the photoelectric conversion element is mounted on a light-transmitting substrate with a conductive material interposed therebetween.

8. An electronic device provided with the photoelectric conversion device according to claim 1 in a display portion.

9. A photoelectric conversion device comprising:
a photoelectric conversion circuit comprising:
a photoelectric conversion element; and
a first field effect transistor wherein a gate terminal and a drain terminal of the first field effect transistor are electrically connected to an anode of the photoelectric conversion element;

a second field effect transistor electrically connected to the first field effect transistor in parallel;

a DC power supply including a high potential terminal and a low potential terminal wherein the low potential terminal is electrically connected to a source terminal of the first field effect transistor and the high potential terminal is electrically connected to a cathode of the photoelectric conversion element; and a voltage detection circuit configured to detect a voltage generated at the cate terminal of the first field effect transistor, the voltage detection circuit being electrically connected to the anode of the photoelectric conversion element, the gate terminal and the drain terminal of the first field effect transistor.

10. The photoelectric conversion device according to claim 9, wherein the photoelectric conversion element comprises a p-type semiconductor layer, an i-type semiconductor layer, and an n-type semiconductor layer.

11. The photoelectric conversion device according to claim 9, wherein the first field effect transistor is a thin film transistor.

12. The photoelectric conversion device according to claim 9, wherein the photoelectric conversion element and the first field effect transistor are provided over a light-transmitting substrate.

13. The photoelectric conversion device according to claim 9, wherein the photoelectric conversion circuit comprises a plurality of the second field effect transistors wherein the plurality of the second field effect transistors are connected in parallel.

14. The photoelectric conversion device according to claim 9, wherein the first field effect transistor is formed by using an SOI substrate.

15. The photoelectric conversion device according to claim 9, wherein the photoelectric conversion element is mounted on a light-transmitting substrate with a conductive material interposed therebetween.

16. An electronic device provided with the photoelectric conversion device according to claim 9 in a display portion.

17. A photoelectric conversion device comprising:
a photoelectric conversion element adapted to be electrically connected to a first terminal of a DC power supply;
a first field effect transistor; and
a second field effect transistor electrically connected to the first field effect transistor in parallel,
wherein a gate terminal and a drain terminal of the first field effect transistor are electrically connected to the photoelectric conversion element,
wherein the gate terminal and the drain terminal of the first field effect transistor are adapted to be electrically connected to a voltage detection circuit, and
wherein a source terminal of the first field effect transistor is adapted to be electrically connected to a second terminal of the DC power supply.

18. The photoelectric conversion device according to claim 17, further comprising the voltage detection circuit configured to detect a voltage generated at the gate terminal of the first field effect transistor.

19. The photoelectric conversion device according to claim 17, further comprising the DC power supply.

20. The photoelectric conversion device according to claim 17, wherein the photoelectric conversion element comprises a p-type semiconductor layer, an i-type semiconductor layer, and an n-type semiconductor layer.

21. The photoelectric conversion device according to claim 17, wherein the first field effect transistor is a thin film transistor.

22. The photoelectric conversion device according to claim 17, wherein the photoelectric conversion element and the first field effect transistor are provided over a light-transmitting substrate.

23. The photoelectric conversion device according to claim 17, wherein the photoelectric conversion device comprises a plurality of the second field effect transistors wherein the plurality of the second field effect transistors are connected in parallel.

24. The photoelectric conversion device according to claim 17, wherein the first field effect transistor is formed by using an SOI substrate.

25. The photoelectric conversion device according to claim 17, wherein the photoelectric conversion element is mounted on a light-transmitting substrate with a conductive material interposed therebetween.

26. An electronic device comprising a display portion provided with the photoelectric conversion device according to claim 17.

* * * * *